United States Patent
Kim et al.

(10) Patent No.: US 12,223,140 B2
(45) Date of Patent: Feb. 11, 2025

(54) DISPLAY DEVICE

(71) Applicant: Samsung Display Co., Ltd., Yongin-Si (KR)

(72) Inventors: Hyungbae Kim, Gyeonggi-do (KR); Hyun-Wook Cho, Yongin-si (KR); Sangkook Kim, Cheonan-si (KR); Taejoon Kim, Seongnam-si (KR); Jaehyun Park, Hwaseong-si (KR); Jiyeong Lee, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 7 days.

(21) Appl. No.: 18/095,906

(22) Filed: Jan. 11, 2023

(65) Prior Publication Data

US 2023/0305658 A1 Sep. 28, 2023

(30) Foreign Application Priority Data

Mar. 28, 2022 (KR) .......................... 10-2022-0037945

(51) Int. Cl.
*G06F 3/041* (2006.01)
*G06F 3/044* (2006.01)
*H10K 59/40* (2023.01)

(52) U.S. Cl.
CPC ........ *G06F 3/0418* (2013.01); *G06F 3/04164* (2019.05); *G06F 3/0446* (2019.05); *H10K 59/40* (2023.02); *G06F 3/0412* (2013.01); *G06F 2203/04111* (2013.01)

(58) Field of Classification Search
CPC .. G06F 3/0418; G06F 3/04164; G06F 3/0446; G06F 3/0412; G06F 2203/04111; G06F 3/04182; H10K 59/40
See application file for complete search history.

(56) References Cited

U.S. PATENT DOCUMENTS

| | | | | |
|---|---|---|---|---|
| 6,211,703 B1 * | 4/2001 | Takekuma | .......... | G06F 13/4077 326/101 |
| 8,947,392 B2 * | 2/2015 | Long | ..................... | G06F 3/0446 178/20.01 |
| 10,839,750 B2 * | 11/2020 | Jung | .................... | G09G 3/3648 |
| 11,144,161 B1 * | 10/2021 | Pundak | ................. | G06F 3/0418 |
| 11,347,361 B2 * | 5/2022 | Kim | ..................... | G06F 3/0448 |

(Continued)

FOREIGN PATENT DOCUMENTS

KR 10-2019-0136309 A 12/2019
KR 10-2021-0086332 A 7/2021

*Primary Examiner* — Amy Onyekaba
(74) *Attorney, Agent, or Firm* — Innovation Counsel LLP

(57) ABSTRACT

Provided is a display device comprising a display panel, an input sensor including a first sensing area having a first sub-area and a second sub-area, and a first sensor controller configured to drive the first sensing area. Here, the input sensor includes first sensing electrodes disposed in the first sub-area to receive a first transmission signal from the first sensor controller, second sensing electrodes disposed in the first sub-area and intersected with the first sensing electrodes, third sensing electrodes disposed in the second sub-area to receive a second transmission signal having a phase inverted from that of the first transmission signal from the first sensor controller, and fourth sensing electrodes disposed in the second sub-area and intersected with the third sensing electrodes.

20 Claims, 22 Drawing Sheets

(56) References Cited

U.S. PATENT DOCUMENTS

| | | | |
|---|---|---|---|
| 11,409,401 B2* | 8/2022 | Hyun | G06F 3/04164 |
| 2011/0090170 A1* | 4/2011 | Lin | G06F 3/0446 |
| | | | 345/174 |
| 2011/0148435 A1* | 6/2011 | Schwartz | G01R 27/2605 |
| | | | 324/658 |
| 2011/0193817 A1* | 8/2011 | Byun | G06F 3/044 |
| | | | 345/174 |
| 2013/0249850 A1* | 9/2013 | Bulea | G06F 3/0445 |
| | | | 345/174 |
| 2014/0152621 A1* | 6/2014 | Okayama | G06F 3/04182 |
| | | | 345/174 |
| 2015/0002458 A1* | 1/2015 | Lee | G06F 3/044 |
| | | | 345/174 |
| 2015/0022494 A1* | 1/2015 | Azumi | G06F 3/0445 |
| | | | 345/174 |
| 2015/0242022 A1* | 8/2015 | Hung | G06F 3/0446 |
| | | | 345/174 |
| 2017/0010715 A1* | 1/2017 | Lee | G06F 3/0448 |
| 2017/0102821 A1* | 4/2017 | Lai | G06F 3/0446 |
| 2018/0224977 A1* | 8/2018 | Takahashi | G06F 3/041 |
| 2019/0018523 A1* | 1/2019 | Xu | G06F 3/0443 |
| 2019/0265857 A1* | 8/2019 | Chou | G06F 3/04164 |
| 2020/0409500 A1* | 12/2020 | Kim | G06F 3/044 |
| 2021/0117047 A1* | 4/2021 | Cho | G06F 3/0446 |
| 2021/0200414 A1 | 7/2021 | Lee et al. | |
| 2021/0366998 A1* | 11/2021 | Kim | G06F 3/0443 |
| 2022/0004281 A1* | 1/2022 | Hyun | G06F 3/0446 |

* cited by examiner

DISPLAY DEVICE

CROSS-REFERENCE TO RELATED APPLICATIONS

This U.S. non-provisional patent application claims priority under 35 U.S.C. § 119 of Korean Patent Application No. 10-2022-0037945, filed on Mar. 28, 2022, the entire contents of which are hereby incorporated by reference.

BACKGROUND

1. Field of Disclosure

The present disclosure herein relates to a display device, and more particularly, to a display device having an input sensing function to reduce electro-magnetic interference in a structure.

2. Description of the Related Art

Multimedia electronic devices such as a television, a mobile phone, a tablet computer, a navigation unit, and a game console include a display device for displaying an image. In addition, the display device is provided in a vehicle.

The display device may include an input sensor providing not only a typical input method such as a button, a keyboard, or a mouse but also a touch-based input method allowing a user to easily input information or command in an intuitive and convenient manner.

SUMMARY

The present disclosure provides a display device capable of reducing electro-magnetic interference in a structure including an input sensor.

An embodiment of the present disclosure provides a display device including a display panel configured to display an image, and an input sensor disposed on the display panel and including a first sensing area configured to sense an input. The first sensing area includes a first sub-area and a second sub-area and a first sensor controller configured to drive the first sensing area.

Here, the input sensor includes first sensing electrodes disposed in the first sub-area to receive a first transmission signal from the first sensor controller, second sensing electrodes disposed in the first sub-area and intersected with the first sensing electrodes, third sensing electrodes disposed in the second sub-area to receive a second transmission signal having a phase inverted from phase of the first transmission signal from the first sensor controller, and fourth sensing electrodes disposed in the second sub-area and intersected with the third sensing electrodes.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1A:
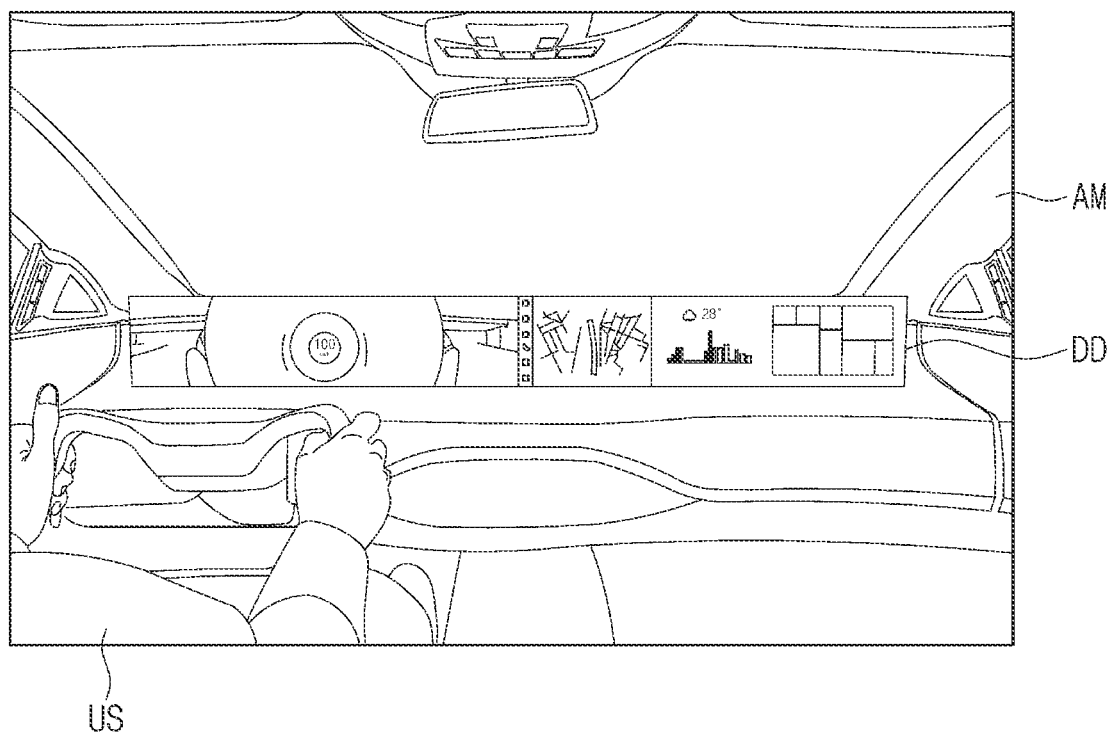
FIG. 1A is a view illustrating an inner structure of a vehicle including a display device according to an embodiment of the present disclosure.

In this specification, it will be understood that when an element such as a region, layer, or portion is referred to as being "on" another element, it can be directly disposed/connected/coupled on the other element or intervening elements may also be present therebetween.

Like reference numerals refer to like elements throughout. Also, in the figures, the thickness, ratio, and dimensions of components are exaggerated for clarity of illustration. As used herein, the term and/or includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, spatially relative terms, such as "below", "lower", "above", and "upper", may be used herein for ease of description to describe an element and/or a feature's relationship to another element(s) and/or feature(s) as illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Hereinafter, embodiments of the present disclosure will be described with reference to the accompanying drawings.

Figure 1B:
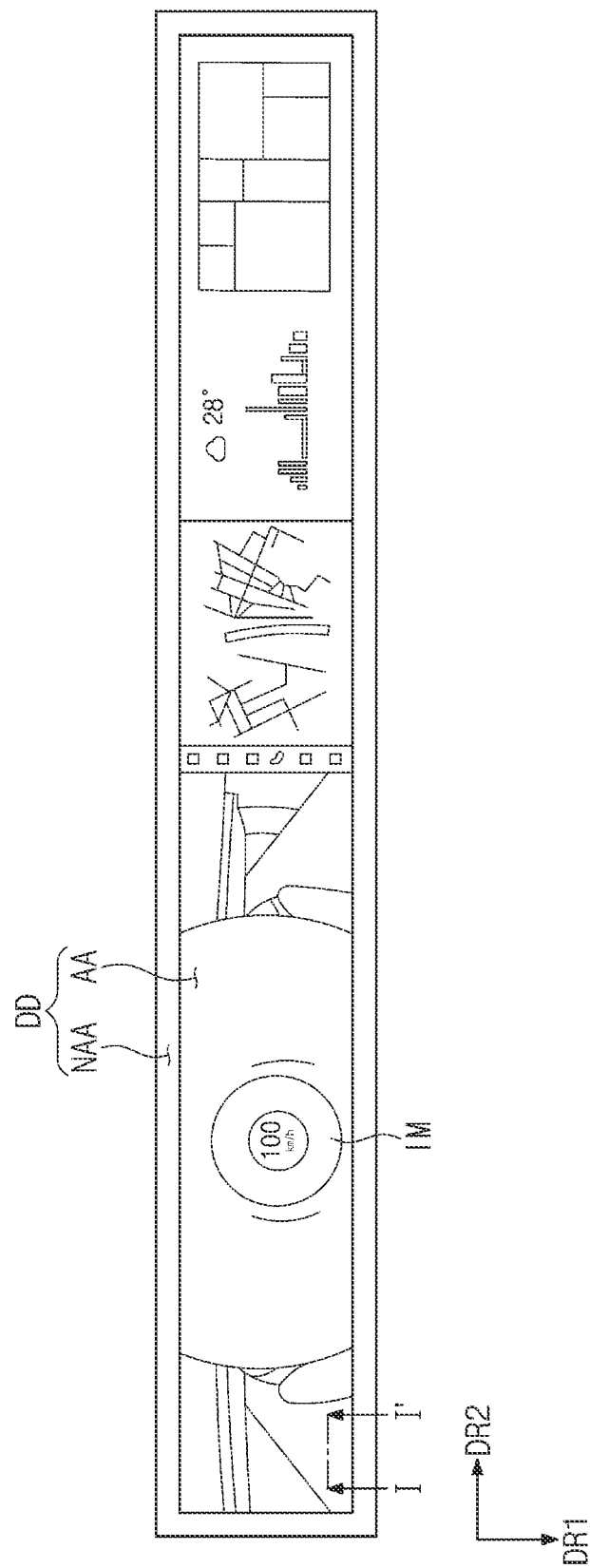
FIG. 1B is a plan view illustrating the display device in FIG. 1A.

FIG. 1A is a view illustrating an inner structure of a vehicle including a display device according to an embodiment of the present disclosure, and FIG. 1B is a plan view illustrating the display device in FIG. 1A.

Referring to FIGS. 1A and 1B, a display device DD may be activated by an electrical signal. For example, the display device DD may be a large-sized display device used in a television, a monitor, an outdoor advertisement board, or a vehicle AM. However, the embodiment of the present disclosure is not limited thereto. For example, the display device DD may be adopted for a small and medium-sized electronic device such as a personal computer, a notebook computer, a personal digital terminal, a portable electronic device, and a camera. Also, the above-described devices are merely embodiments, and thus, the display device DD may be adopted for other electronic devices unless departing from spirit of an embodiment of the present disclosure. In this embodiment, the display device DD disposed in the vehicle AM is illustrated as an example.

On the display device DD, an active area AA and a peripheral area NAA may be defined. The active area AA may be an area in which pixels are disposed and which substantially displays an image IM. The active area AA may extend long a first direction DR1 and a second direction DR2 crossing the first direction DR1. Although the active area AA has a rectangular shape as an example in FIGS. 1A and 1B, the shape of the active area AA may be variously changed according to a shape of the display device DD.

The peripheral area NAA may be an area on which the image IM is not displayed. For example, the peripheral area NAA may surround the active area AA. However, the embodiment of the present disclosure is not limited thereto. The peripheral area NAA may be disposed at only one side of the active area AA or omitted.

The display device DD may sense an input generated by using a body (e.g., a finger) of a user US or an input generated by using an input device. The input device may represent a device except for the body of the user US. For example, the input device may include an active pen, a stylus pen, a touch pen, or an electronic pen. The input generated by using the body of the user US may include various types of external inputs such as a touch generated by using a portion of the body of the user US, heat, or a pressure.

Figure 2A:
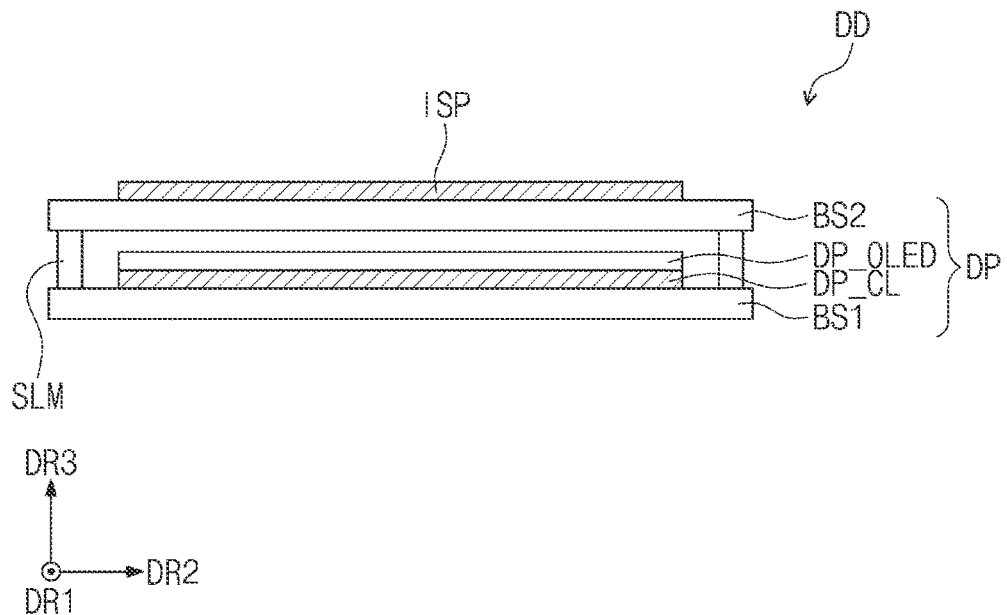
FIG. 2A is a cross-sectional view illustrating the display device according to an embodiment of the present disclosure.
Figure 2B:
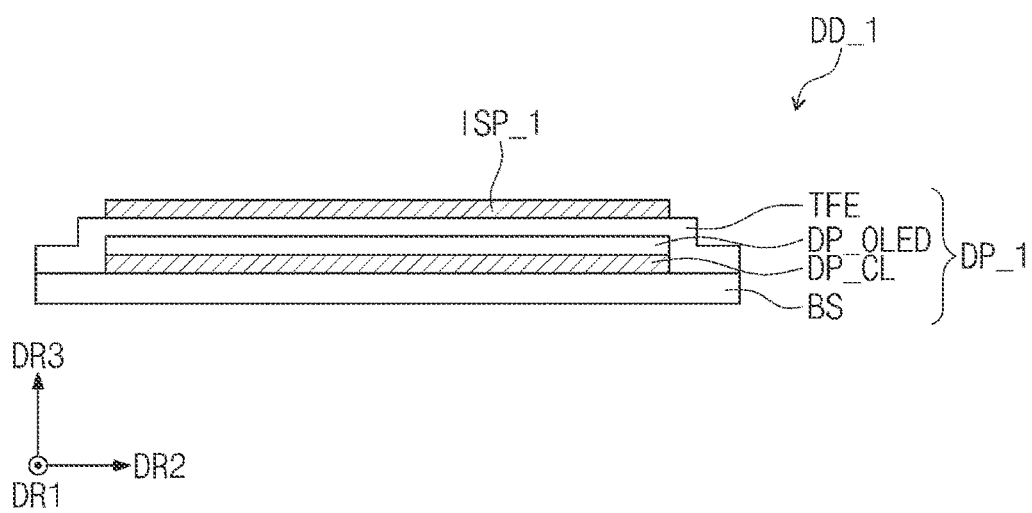
FIG. 2B is a cross-sectional view illustrating a display device according to an embodiment of the present disclosure.
Figure 2C:
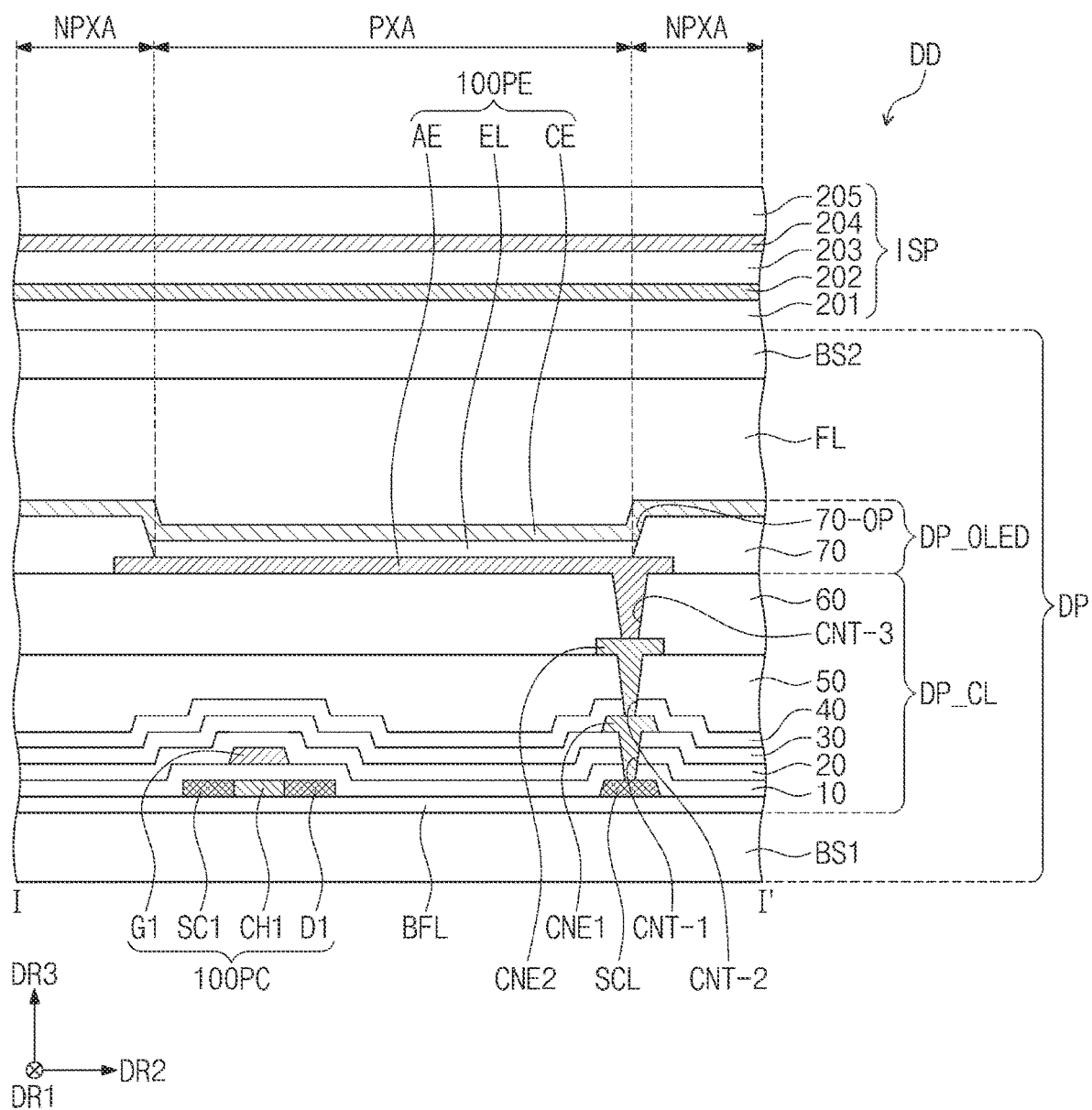
FIGS. 2C and 2D are cross-sectional views obtained by cutting the display device in FIG. 1B along cutting line I-I' according to embodiments of the present disclosure.
Figure 2D:
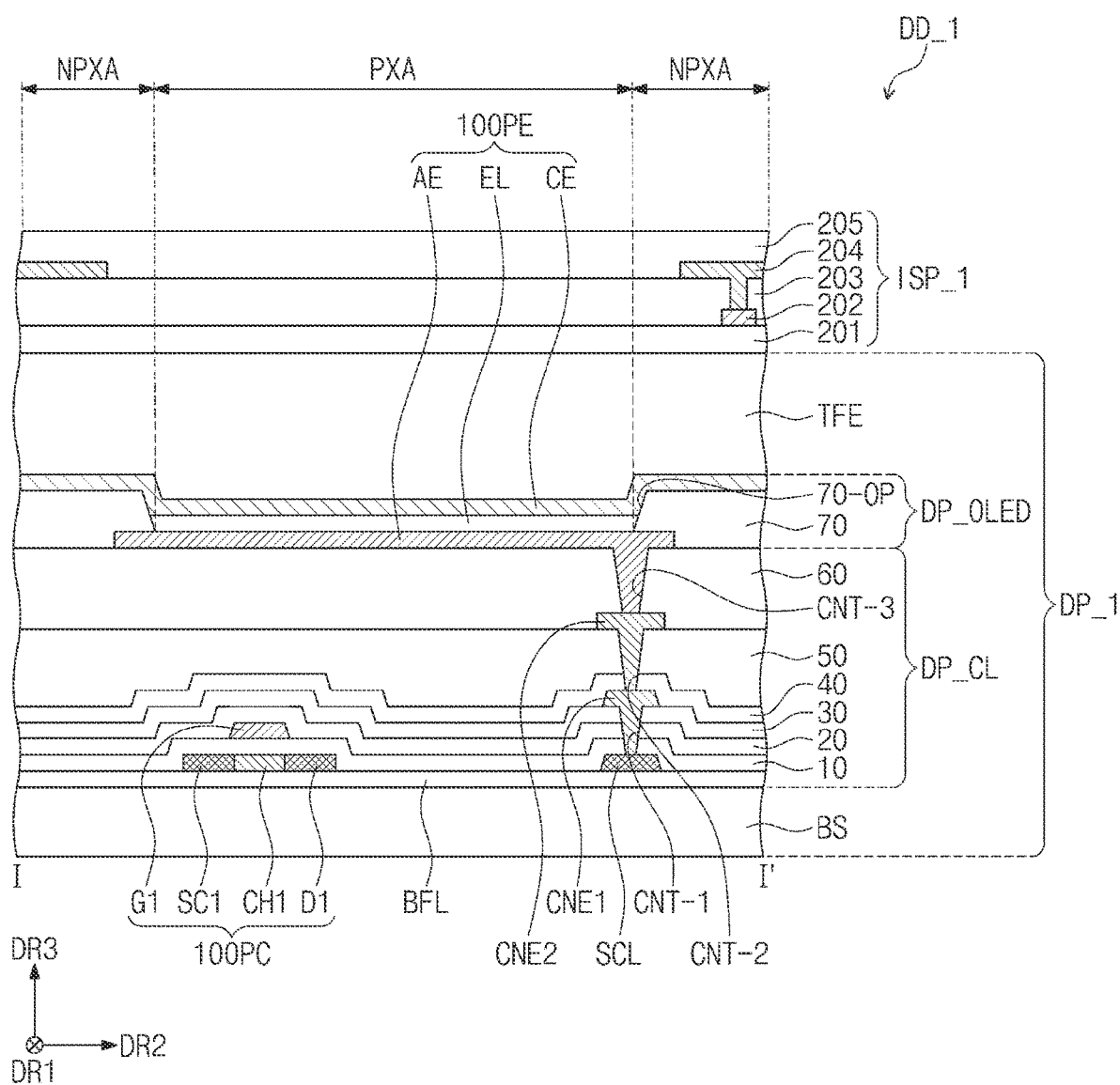

FIG. 2A is a cross-sectional view illustrating the display device according to an embodiment of the present disclosure, FIG. 2B is a cross-sectional view illustrating a display device according to an embodiment of the present disclosure, and FIGS. 2C and 2D are cross-sectional views obtained by cutting the display device in FIG. 1B along cutting line I-I' according to embodiments of the present disclosure.

Referring to FIG. 2A, the display device DD may include a display panel DP and an input sensor ISP. The input sensor ISP may be referred to as an input sensing panel.

The display panel DP may include a first base layer BS1, a display circuit layer DP_CL, a display element layer DP_OLED, a second base layer BS2, and a coupling member SLM. The input sensor ISP may be disposed on the second base layer BS2.

Each of the first base layer BS1 and the second base layer BS2 may be a laminated structure including a silicon substrate, a plastic substrate, a glass substrate, an insulation film, or a plurality of insulation layers.

The display circuit layer DP_CL may be disposed on the first base layer BS1. The display circuit layer DP_CL may include a plurality of insulation layers, a plurality of conductive layers, and a semiconductor layer. The plurality of conductive layers of the display circuit layer DP_CL may constitute signal lines or a control circuit of a pixel.

The display element layer DP_OLED may be disposed on the display circuit layer DP_CL. The display element layer DP_OLED may include light emitting elements. For example, the display element layer DP_OLED may include an organic light emitting diode, an inorganic light emitting diode, a quantum dot, a quantum rod, a micro-LED, or a nano-LED.

The second base layer BS2 may be disposed on the display element layer DP_OLED. A predetermined space may be defined between the second base layer BS2 and the display element layer DP_OLED. That is, both ends of the second base layer BS2 are supported by the coupling member SLM. The space may be filled with air or an inert gas. Also, in an embodiment of the present disclosure, the space may be filled with a filling layer FL (refer to FIG. 2C) such as a silicon-based polymer, an epoxy-based resin, or an acrylic-based resin.

A coupling member SLM may be disposed between the first base layer BS1 and the second base layer BS2. The coupling member SLM may couple the first base layer BS1 and the second base layer BS2. The coupling member SLM may include an organic material such as a photo-curable resin or a photo-setting resin or an inorganic material such as a frit seal. However, the embodiment of the present disclosure is not limited thereto.

The input sensor ISP may include a plurality of insulation layers and a plurality of conductive layers. The plurality of conductive layers may constitute sensing electrodes for sensing an external input, sensing lines that are electrically connected with the sensing electrodes, and sensing pads that are electrically connected with the sensing lines.

Referring to FIG. 2B, a display device DD_1 may include a display panel DP_1 and an input sensor ISP_1. The input sensor ISP_1 may be referred to as an input sensing layer.

The display panel DP_1 may include a base layer BS, a display circuit layer DP_CL, a display element layer DP_OLED, and an encapsulation layer TFE. The base layer BS may be flexible. The input sensor ISP_1 may be disposed on the encapsulation layer TFE. According to an embodiment of the present disclosure, the display panel DP_1 and the input sensor ISP_1 may be provided through a continuous process. That is, the input sensor ISP_1 may be directly provided on the encapsulation layer TFE. However, the embodiment of the present disclosure is not limited thereto.

Referring to FIGS. 2A and 2C, at least one inorganic layer may be provided on a top surface of the first base layer BS1 in the display panel DP. The inorganic layer may include at least one of an aluminum oxide, a titanium oxide, a silicon oxide, a silicon oxynitride, a silicon nitride, a zirconium oxide, and a hafnium oxide. The inorganic layer may have multiple layers. The multilayered inorganic layers may include a barrier layer and/or a buffer layer. In this embodiment, the display panel DP includes a buffer layer BFL.

The buffer layer BFL may be disposed on the first base layer BS1 and improve a coupling force between the first base layer BS1 and a semiconductor pattern. The buffer layer BFL may include a silicon oxide layer and a silicon nitride layer, and the silicon oxide layer and the silicon nitride layer may be alternately laminated with each other.

The semiconductor pattern may be disposed on the buffer layer BFL. The semiconductor pattern may include polysilicon. However, the embodiment of the present disclosure is not limited thereto. For example, the semiconductor pattern may include amorphous silicon, low-temperature polycrystalline silicon, or oxide semiconductor.

FIG. 2C merely illustrates a portion of the semiconductor pattern, and the semiconductor pattern may be further disposed in other areas. The semiconductor pattern may be arranged over pixels according to a particular rule. The semiconductor pattern may have an electrical property that is varied according to whether doped or not. The semiconductor pattern may include a first area having high conductivity and a second area having low conductivity. The first area may be doped with an n-type dopant or a p-type dopant. A p-type transistor may include a doped area that is doped with the p-type dopant, and an n-type transistor may include a doped area that is doped with the n-type dopant. The second area may be an undoped area or a doped area that is doped with a concentration less than that of the first area.

The first area has conductivity greater than that of the second area and substantially serves as an electrode or a signal line. The second area may substantially correspond to a channel region of a transistor. In other words, one portion of the semiconductor pattern may be a channel of a transistor, another portion may be a source or a drain of the transistor, and another portion may be a connection electrode or a connection signal line.

Each of the pixels may have an equivalent circuit including seven transistors, one capacitor, and a light emitting element, and the equivalent circuit of the pixel may be deformed into various shapes. In FIG. 2C, one transistor 100PC and one light emitting element 100PE contained in the pixel are illustrated as an example.

The transistor 100PC may include a source SC1, a channel CH1, a drain D1, and a gate G1. The source SC1, the channel CH1, and the drain D1 may be provided from the semiconductor pattern. The source SC1 and the drain D1 may extend in opposite directions from the channel CH1 on a cross-section. FIG. 2C illustrates a portion of a connection signal line SCL provided from the semiconductor pattern. Although not shown, the connection signal line SCL may be electrically connected to the drain D1 of the transistor 100PC on a plane.

A first insulation layer 10 may be disposed on the buffer layer BFL. The first insulation layer 10 may overlap the plurality of pixels in common and cover the semiconductor pattern. The first insulation layer 10 may be an inorganic layer and/or an organic layer and have a single-layer or multi-layer structure. The first insulation layer 10 may include at least one of an aluminum oxide, a titanium oxide, a silicon oxide, a silicon nitride, a silicon oxynitride, a zirconium oxide, and a hafnium oxide. In this embodiment, the first insulation layer 10 may be a single-layered silicon oxide layer. Also, insulation layers of the display circuit layer DP_CL, which will be described later, may be an inorganic layer and/or an organic layer in addition to the first insulation layer 10 and have a single-layer or multi-layer structure. Although the inorganic layer may include at least one of the above-described materials, the embodiment of the present disclosure is not limited thereto.

The gate G1 is disposed on the first insulation layer 10. The gate G1 may be a portion of a metal pattern. The gate G1 overlaps the channel CH1. The gate G1 may serve as a mask in a process of doping the semiconductor pattern.

A second insulation layer 20 may be disposed on the first insulation layer 10 to cover the gate G1. The second insulation layer 20 may overlap the pixels in common. The second insulation layer 20 may be an inorganic layer and/or an organic layer and have a single-layer or multi-layer structure. The second insulation layer 20 may include at least one of a silicon oxide, a silicon nitride, and a silicon oxynitride. In this embodiment, the second insulation layer 20 may have a multi-layer structure including a silicon oxide layer and a silicon nitride layer.

A third insulation layer 30 may be disposed on the second insulation layer 20. The third insulation layer 30 may have a single-layer or multi-layer structure. For example, the third insulation layer 30 may have a multi-layer structure including a silicon oxide layer and a silicon nitride layer.

A first connection electrode CNE1 may be disposed on the third insulation layer 30. The first connection electrode CNE1 may be connected to the connection signal line SCL viaa contact hole CNT-1 penetratingthrough the first, second, and third insulation layers 10, 20, and 30, respectively.

A fourth insulation layer 40 may be disposed on the third insulation layer 30. The fourth insulation layer 40 may be a single-layered silicon oxide layer. A fifth insulation layer 50 may be disposed on the fourth insulation layer 40. The fifth insulation layer 50 may be an organic layer.

A second connection electrode CNE2 may be disposed on the fifth insulation layer 50. The second connection electrode CNE2 may be connected to the first connection electrode CNE1 viaa contact hole CNT-2 penetratingthrough the fourth and fifth insulation layers 40 and 50.

A sixth insulation layer 60 may be disposed on the fifth insulation layer 50 to cover the second connection electrode CNE2. The sixth insulation layer 60 may be an organic layer.

The display element layer DP_OLED may be disposed on the display circuit layer DP_CL. The display element layer DP_OLED may include a light emitting element 100PE and a pixel defining layer 70. For example, the display element layer DP_OLED may include an organic light emitting material, an inorganic light emitting material, a quantum dot, a quantum rod, a micro-LED, or a nano-LED. Hereinafter, although the light emitting element 100PE will be described as an organic light emitting element as an example, the embodiment of the present disclosure is not limited thereto.

The light emitting element 100PE may include a first electrode AE, a light emitting layer EL, and a second electrode CE. The first electrode AE may be disposed on the sixth insulation layer 60. The first electrode AE may be connected to the second connection electrode CNE2 viaa contact hole CNT-3 penetrating through the sixth insulation layer 60.

A pixel defining layer 70 may be disposed on the sixth insulation layer 60 to cover a portion of the first electrode AE. An opening 70-OP is defined in the pixel defining layer 70. The opening 70-OP of the pixel defining layer 70 exposes at least a portion of the first electrode AE.

The active area AA (refer to FIG. 1B) may include a light emitting area PXA and a non-light emitting area NPXA disposed adjacent to the light emitting area PXA. The non-light emitting area NPXA may surround the light emitting area PXA. In this embodiment, the light emitting area PXA is defined in correspondence to a partial area of the first electrode AE exposed by the opening 70-OP.

The light emitting layer EL may be disposed on the first electrode AE. The light emitting layer EL may be disposed in an area corresponding to the opening 70-OP. That is, the light emitting layer EL may be separately provided in each of the pixels. When the light emitting layer EL is separately provided in each of the pixels, each of the light emitting layers EL may emit light having at least one color of blue, red, and green. However, the embodiment of the present disclosure is not limited thereto. For example, the light emitting layer EL may be connected to the pixels and provided in common. In this case, the light emitting layer EL may provide blue light or white light.

The second electrode CE may be disposed on the light emitting layer EL. The second electrode CE may have an integrated shape and be disposed on the plurality of pixels in common.

Although not shown, a hole control layer may be disposed between the first electrode AE and the light emitting layer EL. The hole control layer may be disposed on the light emitting area PXA and the non-light emitting area NPXA in common. The hole control layer may include a hole transport layer and further include a hole injection layer. An electron control layer may be disposed between the light emitting layer EL and the second electrode CE. The electron control layer may include an electron transport layer and further include an electron injection layer. The hole control layer and the electron control layer may be provided to the plurality of pixels in common by using an open mask.

The second base layer BS2 may be disposed on the display element layer DP_OLED. In an embodiment of the present disclosure, each of the first and second base layers BS1 and BS2 may be rigid.

The filling layer FL may be disposed between the first and second base layers BS1 and BS2. The filling layer FL may be disposed in a space sealed by the coupling member SLM (refer to FIG. 2A) disposed between the first and second base layers BS1 and BS2. The filling layer FL may include a thermosetting material.

The input sensor ISP may be directly disposed on the display panel DP. For example, the input sensor ISP may be directly disposed on the second base layer BS2 without any bonding layer.

Referring to FIGS. 2B and 2D, the encapsulation layer TFE may be disposed on the display element layer DP_OLED. Although the encapsulation layer TFE may include an inorganic layer, an organic layer, and an inorganic layer, which are sequentially laminated, the embodiment of the present disclosure is not limited to the layers of the encapsulation layer TFE.

The inorganic layers may protect the display element layer DP_OLED from moisture and oxygen, and the organic layer may protect the light emitting element layer DP_OLED from foreign substances such as dust particles. The inorganic layers may include a silicon nitride layer, a silicon oxynitride layer, a silicon oxide layer, a titanium oxide layer, or an aluminum oxide layer. Although the organic layer may include an acrylic-based organic layer, the embodiment of the present disclosure is not limited thereto.

The input sensor ISP_1 may be provided on the display panel DP_1 through a continuous process. In this case, the input sensor ISP_1 may be directly disposed on the display panel DP_1. For example, a feature of being "directly disposed" may represent that a third component is not disposed between the input sensor ISP_1 and the display panel DP_1. That is, a separate adhesive or coupling member may not be disposed between the input sensor ISP_1 and the display panel DP_1. Alternatively, the input sensor ISP_1 may be coupled to the display panel DP_1 through an adhesive member or a coupling member. The adhesive member may include a typical adhesive or a typical sticking agent.

Referring to FIGS. 2C and 2D, the input sensor ISP and ISP_1 may include a base insulation layer 201, a first conductive layer 202, a sensing insulation layer 203, a second conductive layer 204, and a cover insulation layer 205. The base insulation layer 201, the first conductive layer 202, the sensing insulation layer 203, the second conductive layer 204, and the cover insulation layer 205 are sequentially stacked in the third direction DR3. As depicted in FIG. 2C, the first conductive layer 202 and the second conductive layer 204 overlap the light emitting area PXA and the non-light emitting area NPXA. However, as depicted in FIG. 2D, the first conductive layer 202 and the second conductive layer 204 overlap the non-light emitting area NPXA and do not overlap the light emitting area PXA.

The base insulation layer 201 may be an inorganic layer including one of a silicon nitride, a silicon oxynitride, and a silicon oxide. Alternatively, the base insulation layer 201 may be an organic layer including an epoxy resin, an acrylic resin, or imide-based resin. The base insulation layer 201 may have a single-layer structure or a multi-layer structure laminated in the third direction DR3.

Each of the first conductive layer 202 and the second conductive layer 204 may have a single-layer structure or a multi-layer structure laminated in the third direction DR3.

The single-layered conductive layer may include a metal layer or a transparent conductive layer. The metal layer may include molybdenum, silver, titanium, copper, aluminum, and an alloy thereof. The transparent conductive layer may include a transparent conductive oxide such as an indium tin oxide (ITO), an indium zinc oxide (IZO), a zinc oxide (ZnO), and an indium zinc tin oxide (IZTO). In addition, the transparent conductive layer may include a conductive polymer such as PEDOT, a metal nano-wire, or a graphene.

The multi-layered conductive layer may include metal layers. The metal layers may have, e.g., a three-layer structure of titanium/aluminum/titanium. The multi-layered conductive layer may include at least one metal layer and at least one transparent conductive layer.

At least one of the sensing insulation layer 203 and the cover insulation layer 205 may include an inorganic layer. The inorganic layer may include at least one of an aluminum oxide, a titanium oxide, a silicon oxide, a silicon nitride, a silicon oxynitride, a zirconium oxide, and a hafnium oxide.

At least one of the sensing insulation layer 203 and the cover insulation layer 205 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

Figure 3:
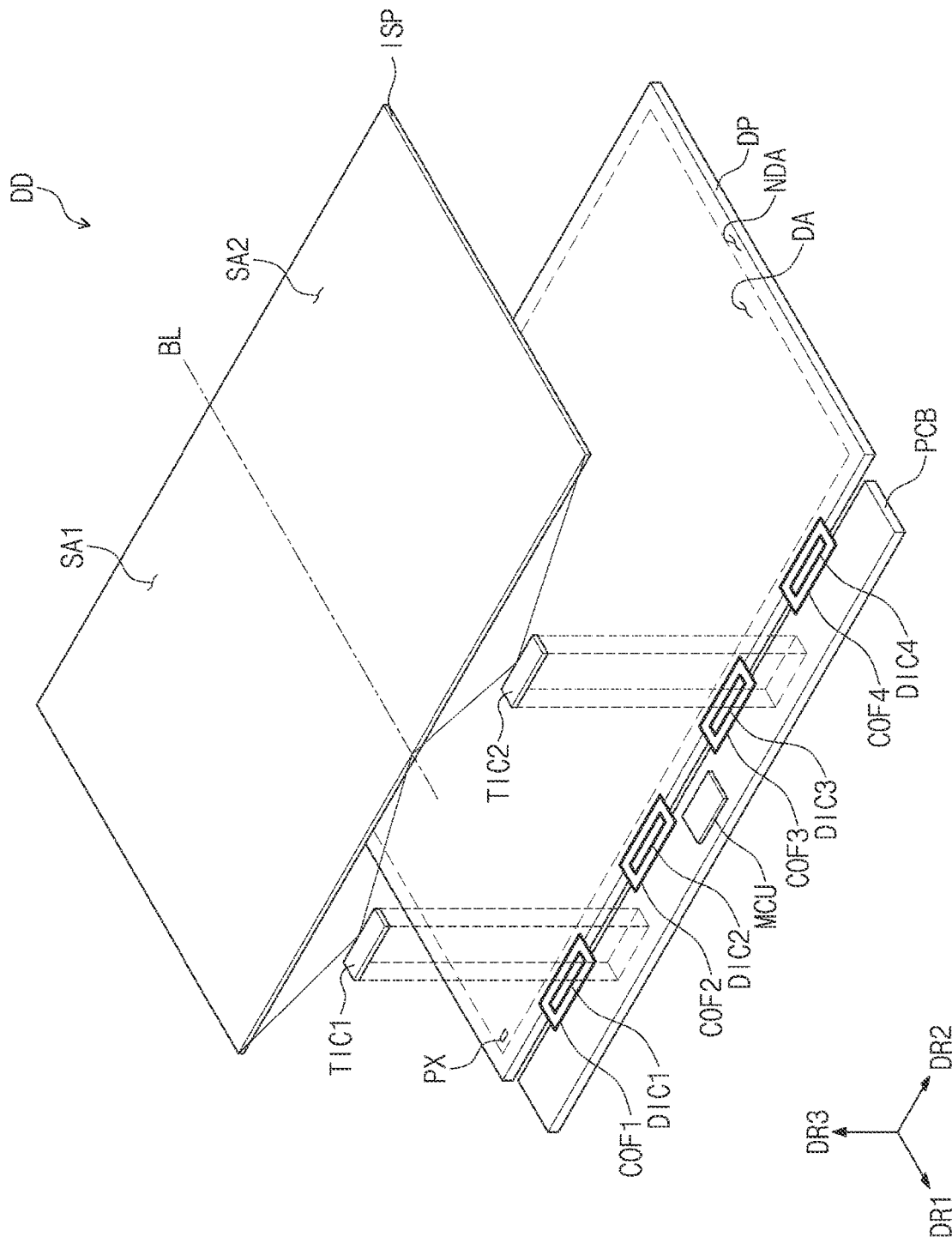
FIG. 3 is an exploded perspective view illustrating the display device according to an embodiment of the present disclosure.

FIG. 3 is an exploded perspective view illustrating the display device according to an embodiment of the present disclosure.

Referring to FIG. 3, the display device DD may include a display panel DP and an input sensor ISP.

The display panel DP may be a component that substantially generates an image. The display panel DP may be a light emitting display panel. For example, the display panel DP may be an organic light emitting display panel, a quantum dot display panel, a micro-LED display panel, or a nano-LED display panel.

The display panel DP includes a display area DA for displaying the image IM (refer to FIG. 1B) and a non-display area NDA disposed adjacent to the display area DA. The display area DA may correspond to the active area AA illustrated in FIG. 1B, and the non-display area NDA may correspond to the peripheral area NAA illustrated in FIG. 1B. The display area DA may be an area that substantially displays an image, and the non-display area NDA may be a bezel area on which an image is not displayed. Although the non-display area NDA surrounds the display area DA in FIG. 3, the embodiment of the present disclosure is not limited thereto. The non-display area NDA may be disposed at only at least one side of the display area DA.

The display panel DP includes a plurality of pixels PX and signal lines connected to the plurality of pixels PX. Each of the plurality of pixels PX may include a light emitting element. The signal lines may include data lines, scan lines, and power lines.

The input sensor ISP may be disposed on the display panel DP. The input sensor ISP may sense an external input applied from the outside. In an embodiment of the present disclosure, the input sensor ISP may overlap the display area DA. The input sensor ISP may include a plurality of areas. Although the input sensor ISP is divided into two areas by a virtual boundary line BL as an example in FIG. 3, the embodiment of the present disclosure is not limited to the number of the areas of the input sensor ISP. Hereinafter, the two areas are referred to as a first sensing area SA1 and a second sensing area SA2, respectively. The first and second sensing areas SA1 and SA2 are adjacent to each other in the second direction DR2.

The display device DD may further include a plurality of data driving chips DIC1, DC2, DC3, and DIC4, a plurality of flexible films COF1, COF2, COF3, and COF4, and a printed circuit board PCB. The plurality of flexible films COF1, COF2, COF3, and COF4 may be disposed between the display panel DP and the printed circuit board PCB to electrically connect the display panel DP and the printed circuit board PCB. Each of the flexible films COF1, COF2, COF3, and COF4 has one end coupled to the display panel DP and the other end coupled to the printed circuit board PCB.

Although the data driving chips DIC1, DC2, DC3, and DIC4 are mounted to the flexible films COF1, COF2, COF3, and COF4, respectively, in FIG. 3, the embodiment of the present disclosure is not limited thereto. That is, the data driving chips DIC1, DC2, DC3, and DIC4 may be directly mounted onto the display panel DP through a chip on glass (COG) method.

All sorts of circuits for generating all sorts of control signals and power signals, which are necessary for driving the display panel DP and the data driving chips DIC1, DC2, DC3, and DIC4, may be provided on the printed circuit board PCB. In an embodiment of the present disclosure, a main controller MCU may be mounted onto the printed circuit board PCB to control an overall operation of the display device DD. For example, the main controller MCU may include at least one microprocessor. The main controller MCU may be referred to as a host. The main controller MCU may further include a graphic controller.

The display device DD may further include a first sensor controller TIC1 and a second sensor controller TIC2 for controlling driving of the input sensor ISP. Although two sensor controllers TIC1 and TIC2 are illustrated as an embodiment of the present disclosure, the embodiment of the present disclosure is not limited thereto, and the number of the sensor controllers may be varied. For example, when the display device DD increases in size, the number of the sensor controllers TIC1 and TIC2 may further increase.

The first sensor controller TIC1 may control driving of the first sensing area SA1 of the input sensor ISP, and the second sensor controller TIC2 may control driving of the second sensing area SA2 of the input sensor ISP. Each of the first and second sensor controllers TIC1 and TIC2 may have a chip shape and be mounted onto the printed circuit board PCB.

The first and second sensor controllers TIC1 and TIC2 may receive a sensing control signal or the like from the main controller MCU. The sensing control signal may include a clock signal or a mode determination signal for determining a driving mode (or sensing mode) of the first and second sensor controllers TIC1 and TIC2. The first and second sensor controllers TIC1 and TIC2 may provide transmission signals that will be described later to the input sensor ISP based on the sensing control signal.

The first and second sensor controllers TIC1 and TIC2 may calculate coordinate information of an input based on reception signals received from the input sensor ISP and provide a coordinate signal having the coordinate information to the main controller MCU. The main controller MCU executes an operation corresponding to the input based on the coordinate signal. For example, the main controller MCU may operate the display panel DP to display a new image on the display panel DP based on the coordinate signal.

Figure 4:
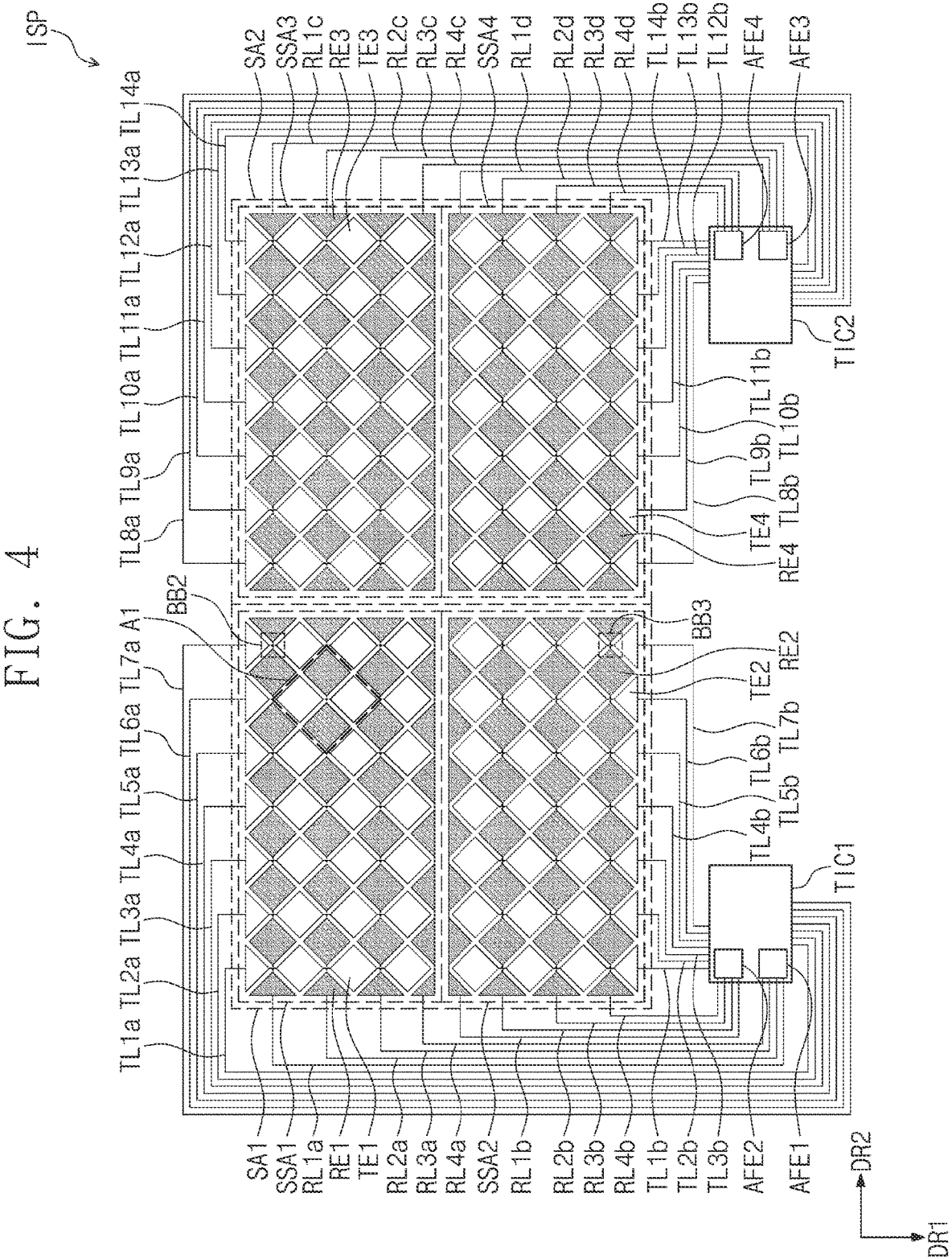
FIG. 4 is a plan view illustrating an input sensor according to an embodiment of the present disclosure.
Figure 5A:
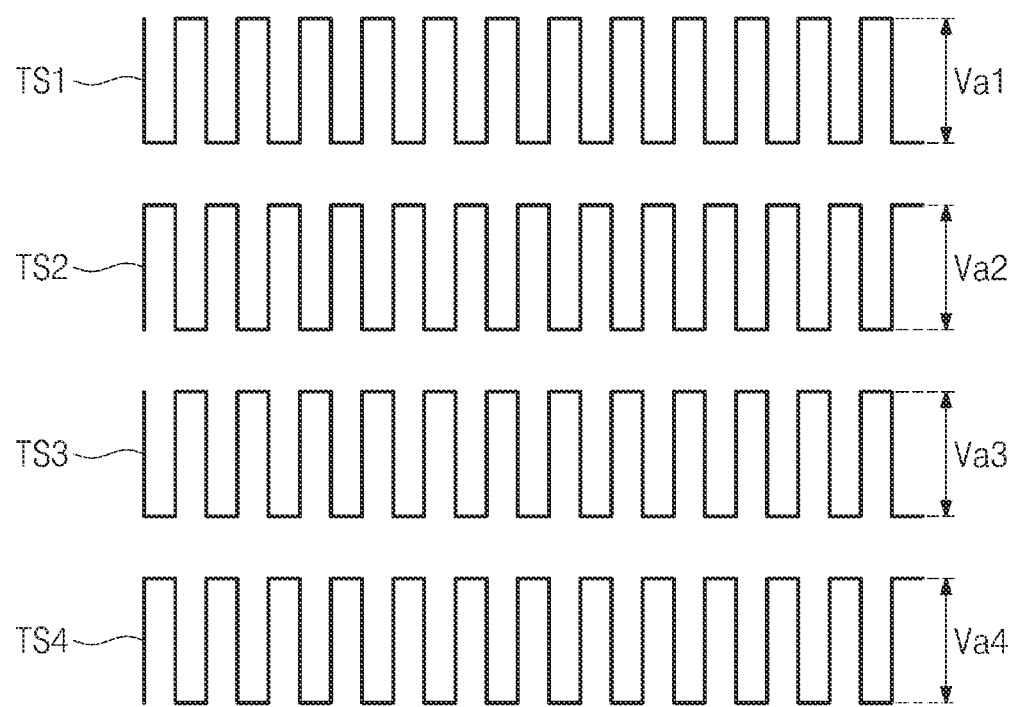
FIG. 5A is a waveform diagram representing first to fourth transmission signals according to an embodiment of the present disclosure.
Figure 5B:
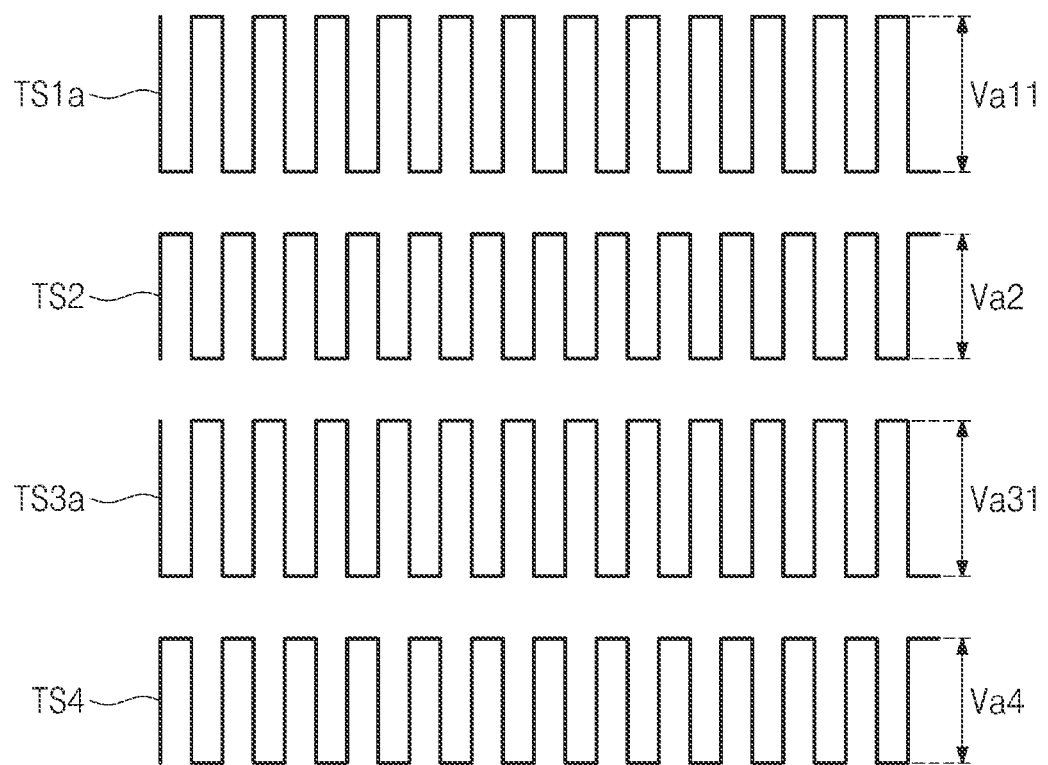
FIG. 5B is a waveform diagram representing first to fourth transmission signals according to an embodiment of the present disclosure.

FIG. 4 is a plan view illustrating the input sensor according to an embodiment of the present disclosure, FIG. 5A is a waveform diagram representing first to fourth transmission signals according to an embodiment of the present disclosure, and FIG. 5B is a waveform diagram representing first to fourth transmission signals according to an embodiment of the present disclosure.

Referring to FIGS. 4, 5A, and 5B, the input sensor ISP includes a first sensing area SA1 and a second sensing area SA2. The first sensing area SA1 and the second sensing area SA2 may be adjacent to each other in the second direction DR2. Although the input sensor ISP includes two sensing areas SA1 and SA2, the embodiment of the present disclosure is not limited thereto. Alternatively, the input sensor ISP may include one sensing area or three or more sensing areas.

The first sensing area SA1 includes a first sub-area SSA1 and a second sub-area SSA2. The first and second sub-area SSA1 and SSA2 may be adjacent to each other in the first direction DR1. The second sensing area SA2 includes a third sub-area SSA3 and a fourth sub-area SSA4. The third and fourth sub-area SSA3 and SSA4 may be adjacent to each other in the first direction DR1.

The input sensor ISP may include first sensing electrodes TE1, second sensing electrodes RE1, third sensing electrodes TE2, and fourth sensing electrodes RE2. The first sensing electrodes TE1 are disposed in the first sub-area SSA1 and receive a first transmission signal TS1 from the first sensor controller TIC1. The second sensing electrodes RE1 are disposed in the first sub-area SSA1 and intersect with the first sensing electrodes TEL The first sensing electrodes TE1 may each extend in the first direction DR1 and be arranged in the second direction DR2. The second sensing electrodes RE1 may each extend in the second direction DR2 and be arranged in the first direction DR1. The third sensing electrodes TE2 are disposed in the second sub-area SSA2 and receive a second transmission signal TS2 from the first sensor controller TIC1. The second transmission signal TS2 may have a phase inverted from that of the first transmission signal TS1. The fourth sensing electrodes RE2 are disposed in the second sub-area SSA2 and intersect with the third sensing electrodes TE2. The third sensing electrodes TE2 may each extend in the first direction DR1 and be arranged in the second direction DR2. The fourth sensing electrodes RE2 may each extend in the second direction DR2 and be arranged in the first direction DR1.

The first sensing electrodes TE1 may be referred to as first transmission electrodes, and the third sensing electrodes TE2 may be referred to as second transmission electrodes. Also, the second sensing electrodes RE1 may be referred to as first reception electrodes, and the fourth sensing electrodes RE2 may be referred to as second reception electrodes.

The number of the first sensing electrodes TE1 disposed in the first sub-area SSA1 is equal to that of the third sensing electrodes TE2 disposed in the second sub-area SSA2. The number of the second sensing electrodes RE1 disposed in the first sub-area SSA1 is equal to that of the fourth sensing electrodes RE2 disposed in the second sub-area SSA2. Although seven first sensing electrodes TE1 are disposed in the first sub-area SSA1, and seven third sensing electrodes TE2 are disposed in the second sub-area SSA2 as an example in FIG. 4, the embodiment of the present disclosure is not limited to the number of each of the first and third sensing electrodes TE1 and TE2. Although four second sensing electrodes RE1 are disposed in the first sub-area SSA1, and four fourth sensing electrodes RE2 are disposed in the second sub-area SSA2 as an example in FIG. 4, the embodiment of the present disclosure is not limited to the number of each of the second and fourth sensing electrodes RE1 and RE2.

A length in the first direction DR1 of each of the first sensing electrodes TE1 may be substantially equal to that in the first direction DR1 of each of the third sensing electrodes TE2. Specifically, the first sensing electrode disposed in a first column among the first sensing electrodes TE1 and the third sensing electrode disposed in a first column among the third sensing electrodes TE2 may have the same length as each other. That is, the first and third sensing electrodes TE1 and TE2 disposed at the same column may have the same length as each other.

In an embodiment of the present disclosure, the first sensing electrodes TE1 and the third sensing electrodes TE2 may have symmetric shapes based on a boundary between the first and second sub-areas SSA1 and SSA2. The first sensing electrodes TE1 and the third sensing electrodes TE2 may be spaced apart from the boundary between the first and second sub-areas SSA1 and SSA2. The first sensing electrodes TE1 and the third sensing electrodes TE2 may be electrically insulated from each other.

A second boundary sensing electrode disposed adjacent to the boundary between the first and second sub-areas SSA1 and SSA2 among the second sensing electrodes RE1 may have a different area (e.g., a half area) from the rest second sensing electrodes. A fourth boundary sensing electrode disposed adjacent to the boundary between the first and second sub-areas SSA1 and SSA2 among the fourth sensing electrodes RE2 may have a different area (e.g., a half area) from the rest second sensing electrodes. However, the embodiment of the present disclosure is not limited thereto. For example, the second boundary sensing electrode may have the same area as the rest second sensing electrodes, and the fourth boundary sensing electrode may also have the same area as the rest fourth sensing electrodes.

The input sensor ISP includes first transmission lines TL1a, TL2a, TL3a, TL4a, TL5a, TL6a, and TL7a, first reception lines RL1a, RL2, RL3, and RL4a, second transmission lines TL1b, TL2b, TL3b, TL4b, TL5b, TL6b, and TL7b, and second reception lines RL1b, RL2b, RL3b, and RL4b. The first transmission lines TL1a, TL2a, TL3a, TL4a, TL5a, TL6a, and TL7a, the first reception lines RL1a, RL2a, RL3a, and RL4a, the second transmission lines TL1b, TL2b, TL3b, TL4b, TL5b. TL6b, and TL7b, and second reception lines RL1b, RL2b, RL3b, and RL4b may be disposed in correspondence to the non-display area NDA (refer to FIG. 3) of the display panel DP (refer to FIG. 3).

Each of the first transmission lines TL1a, TL2a, TL3a, TL4a, TL5a, TL6a, and TL7a are connected to the first sensing electrodes TE1, and each of the first reception lines RL1a, RL2, RL3, and RL4a are connected to the second sensing electrodes RE1. Each of the second transmission lines TL1b, TL2b, TL3b, TL4b, TL5b, TL6b, and TL7b are connected to the third sensing electrodes TE2, and each of the second reception lines RL1b, RL2b, RL3b, and RL4b are connected to the fourth sensing electrodes RE2.

The first transmission lines TL1a, TL2a, TL3a, TL4a, TL5a, TL6a, and TL7a receive the first transmission signal TS1 from the first sensor controller TIC1 and provide the first transmission signal TS1 to the first sensing electrodes TEL The second transmission lines TL1b, TL2b, TL3b, TL4b, TL5b, TL6b, and TL7b receive the second transmission signal TS2 from the first sensor controller TIC1 and provide the second transmission signal TS2 to the third sensing electrodes TE2.

The first sensor controller TIC1 includes a first data acquisition part AFE1 for receiving a first reception signal from the second sensing electrodes RE1 and a second data acquisition part AFE2 for receiving a second reception signal from the fourth sensing electrodes RE2. The first data acquisition part AFE1 receives the first reception signal through the first reception lines RL1a, RL2a, RL3a, and RL4a, and the second data acquisition part AFE2 receives the second reception signal through the second reception lines RL1b, RL2b, RL3b, and RL4b.

The first sensor controller TIC1 may sense a variation of capacitance (hereinafter, referred to as mutual capacitance) between the first and second sensing electrodes TE1 and RE1 in the first sub-area SSA1 based on the first reception signal and generate coordinate information of a position at which the variation is sensed. The first sensor controller TIC1 may sense a variation of mutual capacitance between the third and fourth sensing electrodes TE2 and RE2 in the second sub-area SSA2 based on the second reception signal and generate coordinate information of a position at which the variation is sensed.

The input sensor ISP may further include fifth sensing electrodes TE3, sixth sensing electrodes RE3, seventh sensing electrodes TE4, and eighth sensing electrodes RE4. The fifth sensing electrodes TE3 are disposed in the third sub-area SSA3 and receive a third transmission signal TS3 from the second sensor controller TIC2. The sixth sensing electrodes RE3 are disposed in the third sub-area SSA3 and intersect with the fifth sensing electrodes TE3. The fifth sensing electrodes TE3 may each extend in the first direction DR1 and be arranged in the second direction DR2. The sixth sensing electrodes RE3 may each extend in the second direction DR2 and be arranged in the first direction DR1. The seventh sensing electrodes TE4 are disposed in the fourth sub-area SSA4 and receive a fourth transmission signal TS4 from the second sensor controller TIC2. The fourth transmission signal TS4 may have a phase inverted from that of the third transmission signal TS3. The eighth sensing electrodes RE4 are disposed in the fourth sub-area SSA4 and intersect with the seventh sensing electrodes TE4. The seventh sensing electrodes TE3 may each extend in the first direction DR1 and be arranged in the second direction DR2. The eighth sensing electrodes RE4 may each extend in the second direction DR2 and be arranged in the first direction DR1.

The fifth sensing electrodes TE3 may be referred to as third transmission electrodes, and the seventh sensing electrodes TE4 may be referred to as fourth transmission electrodes. Also, the sixth sensing electrodes RE3 may be referred to as third reception electrodes, and the eighth sensing electrodes RE4 may be referred to as fourth reception electrodes.

The number of the fifth sensing electrodes TE3 disposed in the third sub-area SSA3 is equal to that of the seventh sensing electrodes TE4 disposed in the fourth sub-area SSA4. The number of the sixth sensing electrodes RE3 disposed in the third sub-area SSA3 is equal to that of the eighth sensing electrodes RE4 disposed in the fourth sub-area SSA4. The third sub-area SSA3 is adjacent to the first sub-area SSA1 in the second direction DR2, and the fourth sub-area SSA4 is adjacent to the second sub-area SSA2 in the second direction DR2. The number of the fifth sensing electrodes TE3 may be equal to that of the first sensing electrodes TE1, and the number of the seventh sensing electrodes TE4 may be equal to that of the third sensing electrodes TE2.

Although seven fifth sensing electrodes TE3 are disposed in the third sub-area SSA3, and seven seventh sensing electrodes TE4 are disposed in the fourth sub-area SSA4 as an example in FIG. 4, the embodiment of the present disclosure is not limited to the number of each of the fifth and seventh sensing electrodes TE3 and TE4. Although four sixth sensing electrodes RE3 are disposed in the third sub-area SSA3, and four eighth sensing electrodes RE4 are disposed in the fourth sub-area SSA4 as an example in FIG. 4, the embodiment of the present disclosure is not limited to the number of each of the sixth and eighth sensing electrodes RE3 and RE4.

A length in the first direction DR1 of each of the fifth sensing electrodes TE3 may be substantially equal to that in the first direction DR1 of each of the seventh sensing electrodes TE4. Specifically, the fifth sensing electrode disposed in a first column among the fifth sensing electrodes TE3 and the seventh sensing electrode disposed in a first column among the seventh sensing electrodes TE4 may have the same length as each other. That is, the fifth and seventh sensing electrodes TE3 and TE4 disposed at the same column may have the same length as each other.

In an embodiment of the present disclosure, the fifth sensing electrodes TE3 and the seventh sensing electrodes TE4 may have symmetric shapes based on a boundary between the third and fourth sub-areas SSA3 and SSA4. The fifth sensing electrodes TE3 and the seventh sensing electrodes TE4 may be spaced apart from the boundary between the third and fourth sub-areas SSA3 and SSA4. The fifth sensing electrodes TE3 and the seventh sensing electrodes TE4 may be electrically insulated from each other. In an embodiment of the present disclosure, the first sensing electrodes TE1 and fifth sensing electrodes TE3 may have symmetric shapes based on a boundary between the first and third sub-areas SSA1 and SSA3. In an embodiment of the present disclosure, the third sensing electrodes TE2 and the seventh sensing electrodes TE4 may have symmetric shapes based on a boundary between the second and fourth sub-areas SSA2 and SSA4.

The input sensor ISP further includes third transmission lines TL8a, TL9a, TL10a, TL11a, T112a, T113a, and TL14a, third reception lines RL1c, RL2c, RL3c, and RL4c, fourth transmission lines TL8b, TL9b, TL10b, TL11b, TL12b, TL13b, and TL14b, and fourth reception lines RL1d, RL2d, RL3d, and RL4d. The third transmission lines TL8a, TL9a, TL10a, TL11a, T112a, T113a, and TL14a, the third reception lines RL1c, RL2c, RL3c, and RL4c, the fourth transmission lines TL8b, TL9b, TL10b, TL11b, TL12b, TL13b, and TL14b, and the fourth reception lines RL1d, RL2d, RL3d, and RL4d may be disposed in correspondence to the non-display area NDA of the display panel DP.

Each of the third transmission lines TL8a, TL9a, TL10a, TL11a, T112a, T113a, and TL14a are connected to the fifth sensing electrodes TE3, and each of the third reception lines RL1c, RL2c, RL3c, and RL4c are connected to the sixth sensing electrodes RE3. Each of the fourth transmission lines TL8b, TL9b, TL10b, TL11b, TL12b, TL13b, and TL14b are connected to the seventh sensing electrodes TE4, and each of the fourth reception lines RL1d, RL2d, RL3d, and RL4d are connected to the eighth sensing electrodes RE4.

The third transmission lines TL8a, TL9a, TL10a, TL11a, T112a, T113a, and TL14a receive the third transmission signal TS3 from the second sensor controller TIC2 and provide the third transmission signal TS3 to the fifth sensing electrodes TE3. The fourth transmission lines TL8b, TL9b, TL10b, TL11b, TL12b, TL13b, and TL14b receive the fourth transmission signal TS4 from the second sensor controller TIC2 and provide the fourth transmission signal TS4 to the seventh sensing electrodes TE4.

The second sensor controller TIC2 includes a third data acquisition part AFE3 for receiving a third reception signal from the sixth sensing electrodes RE3 and a fourth data acquisition part AFE4 for receiving a fourth reception signal from the eighth sensing electrodes RE4. The third data acquisition part AFE3 receives the third reception signal through the third reception lines RL1c to RL4c, and the fourth data acquisition part AFE4 receives the fourth reception signal through the second reception lines RL1d, RL2d, RL3d, and RL4d.

The second sensor controller TIC2 may sense a variation of mutual capacitance between the fifth and sixth sensing electrodes TE3 and RE3 caused by an external input in the third sub-area SSA3 based on the third reception signal and generate coordinate information of a position at which the variation is sensed. The second sensor controller TIC2 may sense a variation of mutual capacitance between the seventh and eighth sensing electrodes TE4 and RE4 in the fourth sub-area SSA4 based on the third reception signal and generate coordinate information of a position at which the variation is sensed.

Referring to FIG. 5A, the first transmission signal TS1 provided from the first sensing electrodes TE1 may be a square wave signal that swings with a first amplitude Va1. The second transmission signal TS2 provided from the third sensing electrodes TE2 may be a square wave signal that swings with a second amplitude Va2. The second transmission signal TS2 may have a phase inverted from that of the first transmission signal TS1. In an embodiment of the present disclosure, the second amplitude Va2 of the second transmission signal TS2 may be equal to the first amplitude Va1 of the first transmission signal TS1.

The third transmission signal TS3 provided from the fifth sensing electrodes TE3 may be a square wave signal that swings with a third amplitude Va3. The fourth transmission signal TS4 provided from the seventh sensing electrodes TE4 may be a square wave signal that swings with a fourth amplitude Va4. The fourth transmission signal TS4 may have a phase inverted from that of the third transmission signal TS3. In an embodiment of the present disclosure, the fourth amplitude Va4 of the fourth transmission signal TS4 may be equal to the third amplitude Va3 of the third transmission signal TS3. However, the embodiment of the present disclosure is not limited thereto.

Although not shown, in an embodiment of the present disclosure, the first transmission signal TS1 may have a phase inverted from that of the third transmission signal TS3, and the second transmission signal TS2 may have a phase inverted from that of the fourth transmission signal TS4. The first amplitude Va1 of the first transmission signal TS1 may be equal to the third amplitude Va3 of the third transmission signal TS3, and the second amplitude Va2 of the second transmission signal TS2 may be equal to the fourth amplitude Va4 of the fourth transmission signal TS4.

When the first transmission signal TS1 is provided to the first sub-area SSA1, and the second transmission signal TS2 having the phase inverted from that of the first transmission signal TS1 is provided to the second sub-area SSA2, destructive interference may be generated between the first and second transmission signals TS1 and TS2. When the destructive interference is generated between the first and second transmission signals TS1 and TS2, electro-magnetic interference (EMI) may be improved in comparison with a case when the first and second transmission signals TS1 and TS2 are transmitted with the same phase.

Also, the first transmission signal TS1 provided to the first sub-area SSA1 has a phase inverted from that of the third transmission signal TS3 provided to the third sub-area SSA3. Thus, the destructive interference may be also generated between the first and third transmission signals TS1 and TS3. Likewise, the second transmission signal TS2 provided to the second sub-area SSA2 has a phase inverted from that of the fourth transmission signal TS4 provided to the fourth sub-area SSA4. Thus, the destructive interference may be also generated between the second and fourth transmission signals TS2 and TS4. As the destructive interference is generated between adjacent sub-areas SSA1 to SSA4, the electro-magnetic interference (EMI) may be further improved.

Referring to FIG. 5B, a second amplitude Va2 of a second transmission signal TS2 may be different from a first amplitude Va11 of a first transmission signal TS1a. For example, the first amplitude Va11 of the first transmission signal TS1a may be greater than the second amplitude Va2 of the second transmission signal TS2. An amplitude difference between the first transmission signal TS1a and the second transmission signal TS2 may be set according to a line resistance difference between the first transmission lines TL1a, TL2a, TL3a, TL4a, TL5a, TL6a, and TL7a and the second transmission lines TL1b, TL2b, TL3b, TL4b, TL5b, TL6b, and TL7b. Thus, the destructive interference may be effectively generated by only adjusting the amplitude of the first and second transmission signals TS1a and TS2 instead of performing an equivalent resistance design for compensating the line resistance difference between the first transmission lines TL1a, TL2a, TL3a, TL4a, TL5a, TL6a, and TL7a and the second transmission lines TL1b, TL2b, TL3b, TL4b, TL5b, TL6b, and TL7b.

Also, a fourth amplitude Va4 of a fourth transmission signal TS4 may be different from a third amplitude Va31 of a third transmission signal TS3a. For example, the third amplitude Va31 of the third transmission signal TS3a may be greater than the fourth amplitude Va4 of the fourth transmission signal TS4. An amplitude difference between the third transmission signal TS3a and the fourth transmission signal TS4 may be set according to a line resistance difference between the third transmission lines TL8a, TL9a, TL10a, TL11a, TL12a, TL13a, and TL14a and the fourth transmission lines TL8b, TL9b, TL10b, TL11b, TL12b, TL13b, and TL14b. Thus, the destructive interference may be effectively generated by only adjusting the amplitude of the third and fourth transmission signals TS3a and TS4 instead of performing an equivalent resistance design for compensating the line resistance difference between the third transmission lines TL8a, TL9a, TL10a, TL11a, TL12a, TL13a, and TL14a and the fourth transmission lines TL8b, TL9b, TL10b, TL11b, TL12b, TL13b, and TL14b.

Figure 6A:
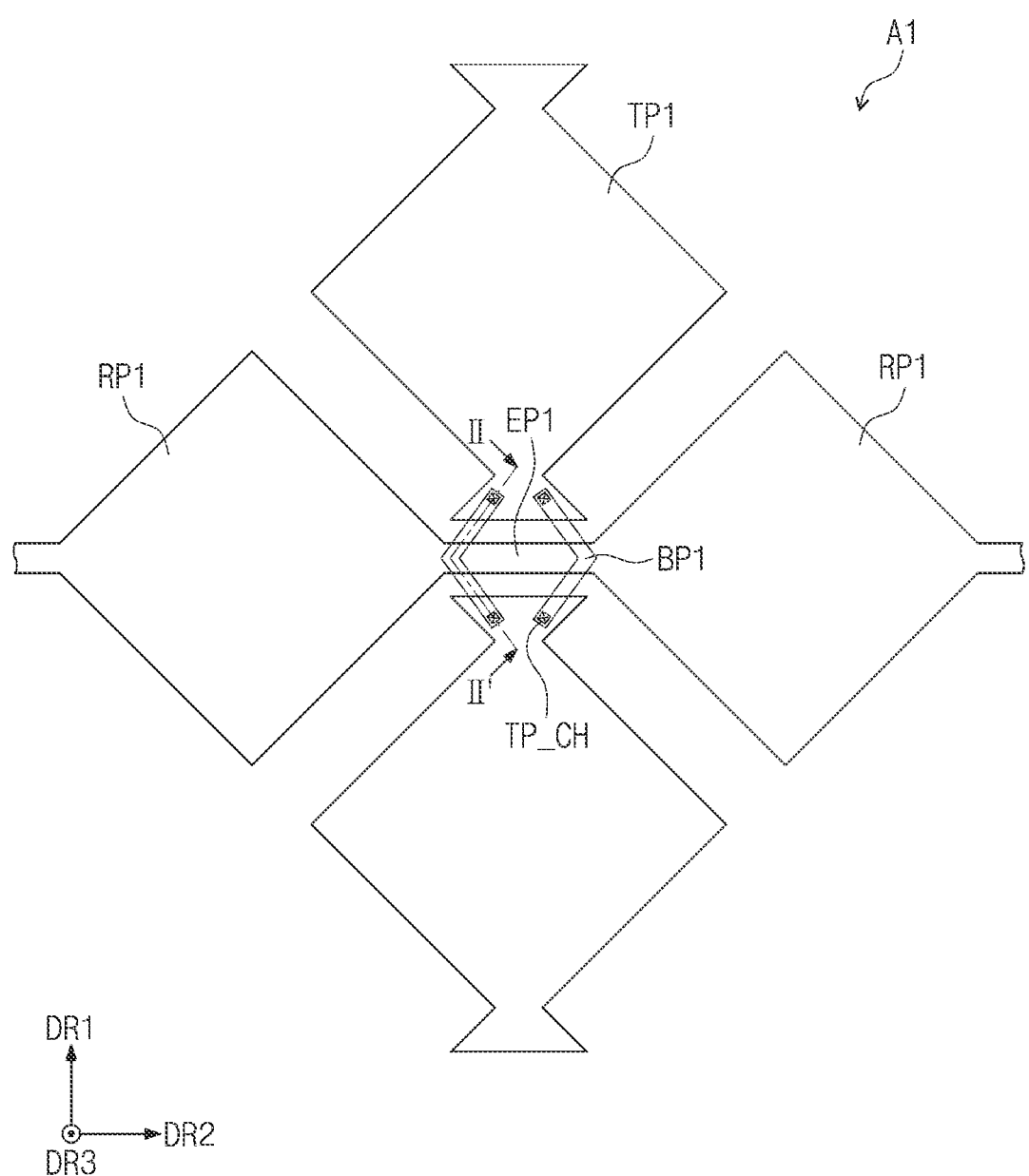
FIG. 6A is an enlarged plan view illustrating a portion of the input sensor in FIG. 4.
Figure 6B:
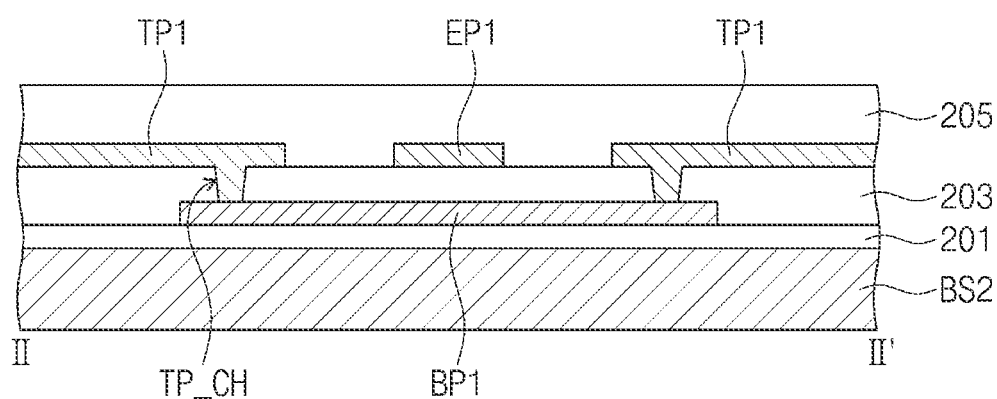
FIG. 6B is a cross-sectional view taken along line II-II' in FIG. 6A.
Figure 7A:
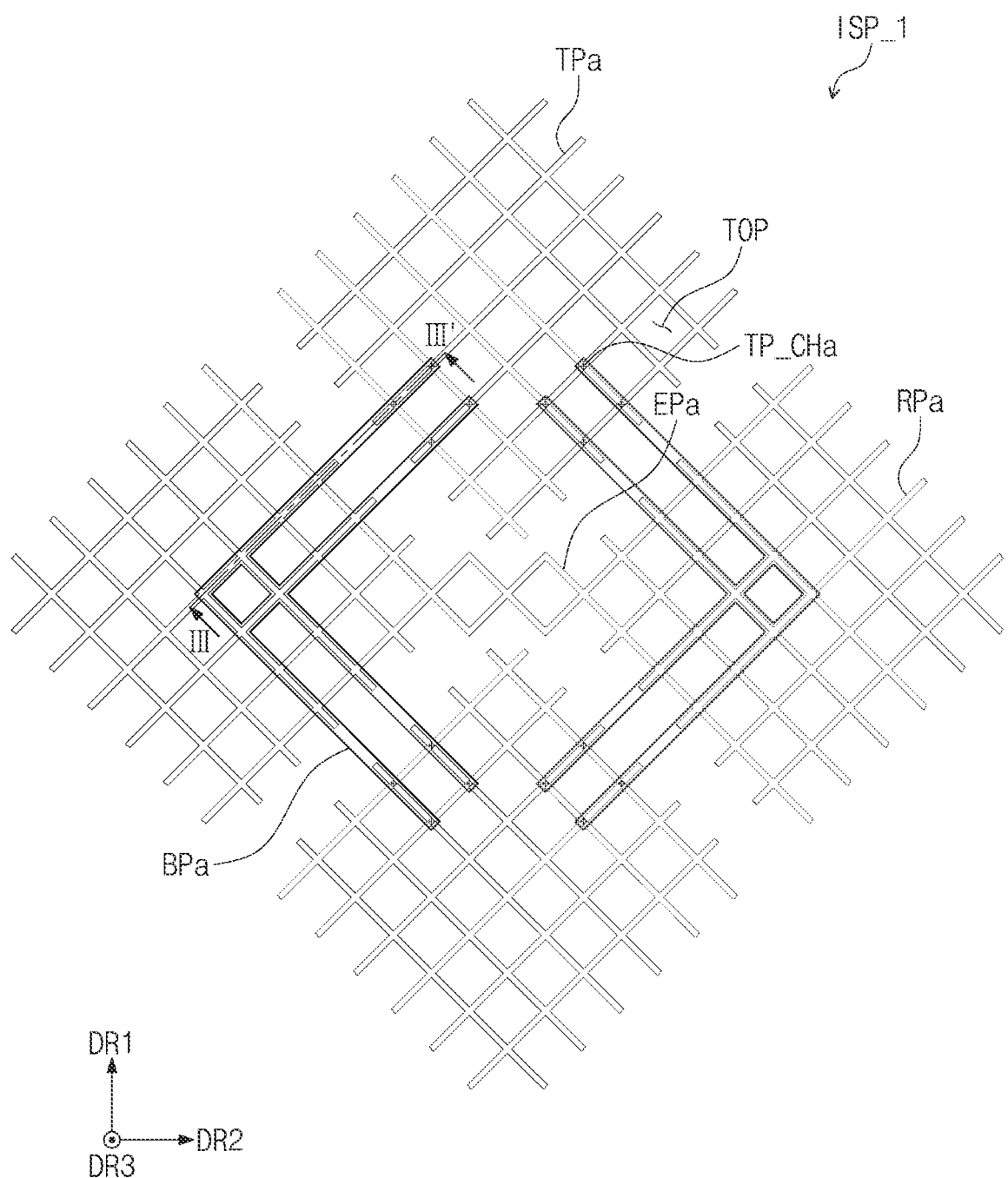
FIG. 7A is an enlarged plan view illustrating a portion of an input sensor according to an embodiment of the present disclosure.
Figure 7B:
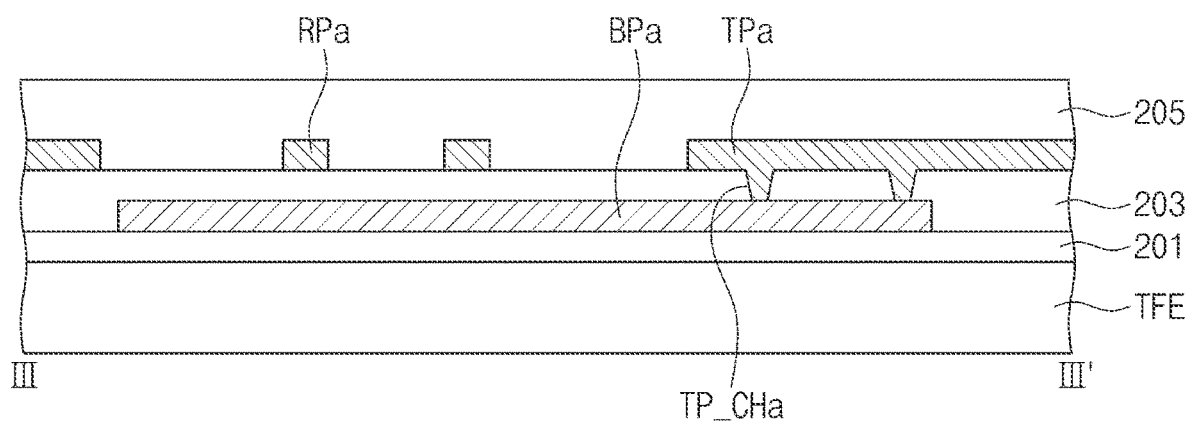
FIG. 7B is a cross-sectional view taken along line III-III' in FIG. 7A.

FIG. 6A is an enlarged plan view illustrating a portion of the input sensor in FIG. 4, and FIG. 6B is a cross-sectional view taken along line II-II' in FIG. 6A. FIG. 7A is an enlarged plan view illustrating a portion of an input sensor according to an embodiment of the present disclosure, and FIG. 7B is a cross-sectional view taken along line III-III' in FIG. 7A.

Referring to FIGS. 6A and 6B, each of the first sensing electrodes TE1 may include a plurality of first sensing patterns TP1 and a plurality of first bridge patterns BP1, which are arranged in the first direction DR1. At least one first bridge pattern BP1 may be connected to two adjacent first sensing patterns TP1

A sensing insulation layer 203 may be disposed between the plurality of first sensing patterns TP1 and the plurality of first bridge patterns BP1, and each of the plurality of first bridge patterns BP1 may be connected to the corresponding first sensing patterns TP1 through contact holes TP_CH defined in the sensing insulation layer 203.

Each of the second sensing electrodes RE1 may include a plurality of second sensing patterns RP1 and a plurality of first extension patterns EP1, which are arranged in the second direction DR2. At least one first extension pattern EP1 may be connected between two adjacent second sensing patterns RP1. The first extension pattern EP1 may be integrated with two adjacent second sensing patterns RP1. The first extension patterns EP1 may be insulated from the first bridge patterns BP1 and intersect with the first bridge patterns BP1.

The first and second sensing patterns TP1 and RP1 and the first extension patterns EP1 may be disposed on the same layer (e.g., the sensing insulation layer 203). The first bridge patterns BP1 may be disposed on a layer (e.g., the base insulation layer 201) different from the sensing insulation layer 203.

In an embodiment of the present disclosure, the first and second sensing patterns TP1 and RP1 and the first extension patterns EP1 may be included in the second conductive layer 204 in FIG. 2C, and the first bridge patterns BP1 may be included in the first conductive layer 202 in FIG. 2C.

In an embodiment of the present disclosure, each of the first and second sensing patterns TP1 and RP1, the first extension patterns EP1, and the first bridge patterns BP1 may include a transparent conductive layer. Each of the first and second sensing patterns TP1 and RP1 may have a size for covering the plurality of light emitting elements 100PE (refer to FIG. 2C).

Referring to FIGS. 7A and 7B, as an embodiment of the present disclosure, each of first and second sensing patterns TPa and RPa, first extension patterns EPa, and first bridge patterns BPa may include a metal layer. Each of the first and second sensing patterns TPa and RPa, the first extension patterns EPa, and the first bridge patterns BPa may have a mesh shape. Each of the plurality of first bridge patterns BPa may be connected to the corresponding first sensing patterns TPa through contact holes TP_CHa defined in the sensing insulation layer 203.

Thus, touch openings TOP may be defined in each of the first and second sensing patterns TPa and RPa. In an embodiment of the present disclosure, each of the touch openings TOP may have a rhombus shape.

When viewed on a plane, the plurality of light emitting elements 100PE (refer to FIG. 2D) may be disposed in the touch openings TOP, respectively.

Thus, light generated by the light emitting elements 100PE may be emitted normally instead of being affected by the first and second sensing patterns TPa and RPa.

Figure 8A:
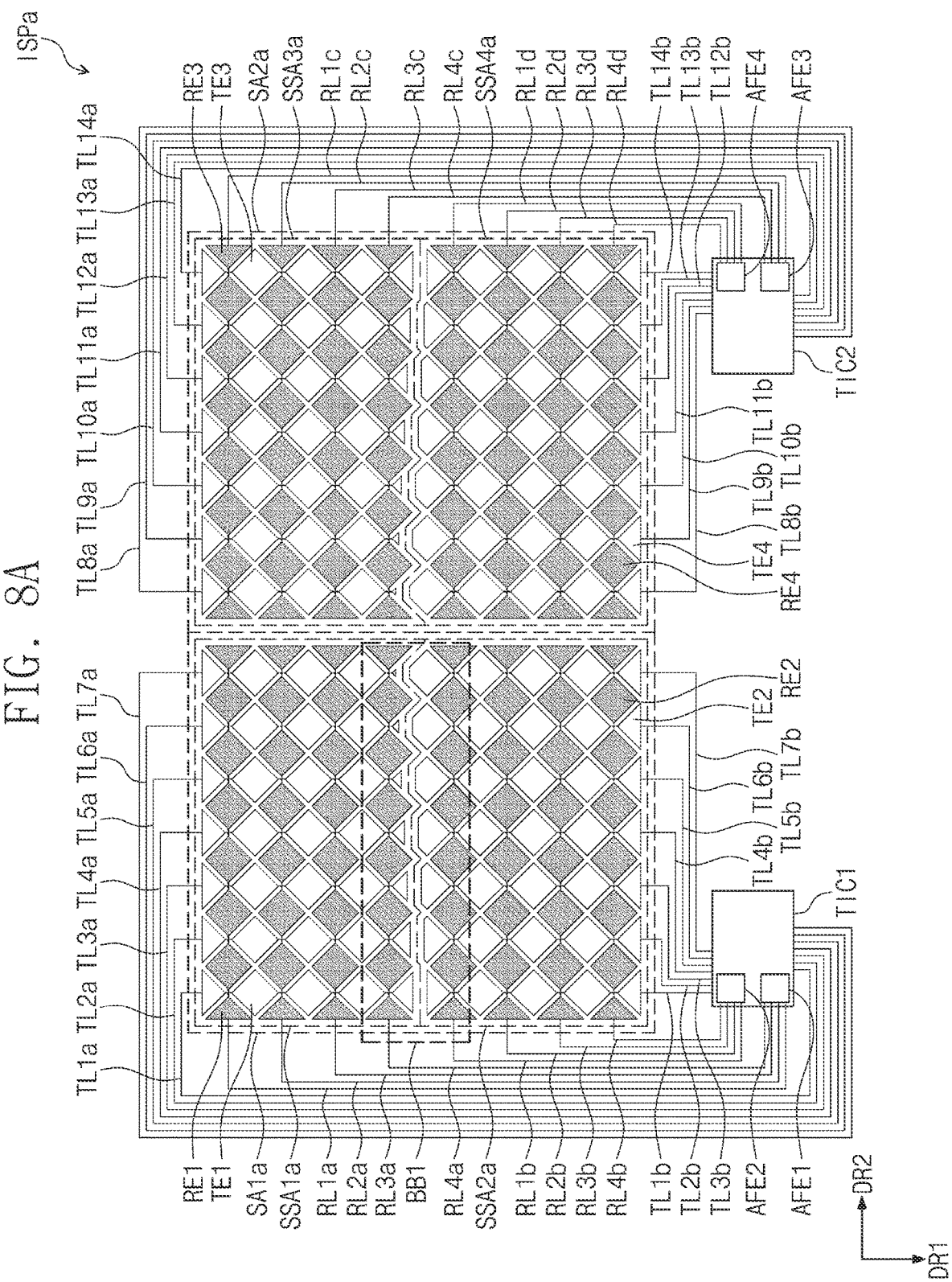
FIG. 8A is a plan view illustrating an input sensor according to an embodiment of the present disclosure.
Figure 8B:
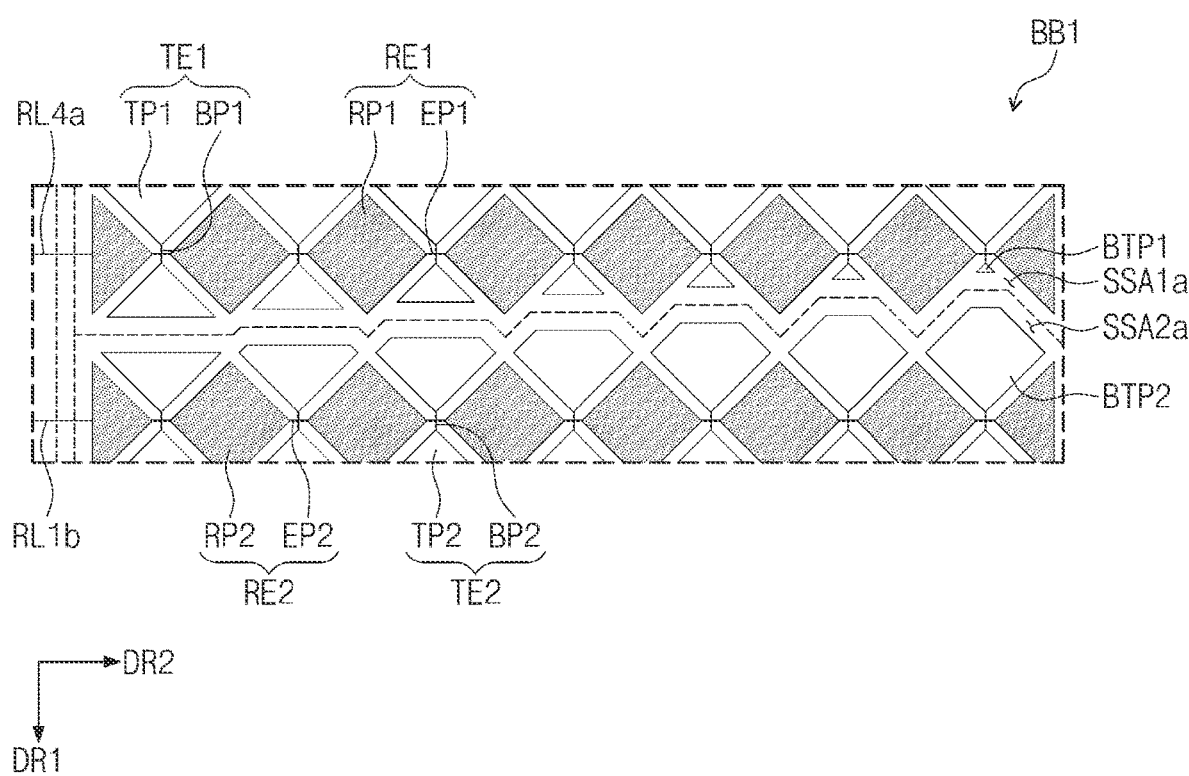
FIG. 8B is an enlarged plan view illustrating a first portion in FIG. 8A.

FIG. 8A is a plan view illustrating an input sensor according to an embodiment of the present disclosure, and FIG. 8B is an enlarged plan view illustrating a first portion BB 1 in FIG. 8A. In FIG. 8A, the same components as those of FIG. 4 will be designated by the same reference numerals, and overlapped descriptions thereof will be omitted.

Referring to FIGS. 8A and 8B, an input sensor ISPa includes a first sensing area SA1a and a second sensing area SA2a. The first sensing area SA1a and the second sensing area SA2a may be adjacent to each other in the second direction DR2.

The first sensing area SA1a includes a first sub-area SSA1a and a second sub-area SSA2a. The first and second sub-area SSA1a and SSA2a may be adjacent to each other in the first direction DR1. The second sensing area SA2a includes a third sub-area SSA3a and a fourth sub-area SSA4a. The third and fourth sub-area SSA1a and SSA2a may be adjacent to each other in the first direction DR1.

The input sensor ISPa may include first sensing electrodes TE1, second sensing electrodes RE1, third sensing electrodes TE2, and fourth sensing electrodes RE2.

Each of the first sensing electrodes TE1 may include a plurality of first sensing patterns TP1 and a plurality of first bridge patterns BP1, which are arranged in the first direction DR1. At least one first bridge pattern BP1 may be connected between two adjacent first sensing patterns TP1. Each of the second sensing electrodes RE1 may include a plurality of second sensing patterns RP1 and a plurality of first extension patterns EP1, which are arranged in the second direction DR2. At least one first extension pattern EP1 may be connected between two adjacent second sensing patterns RP1.

Each of the third sensing electrodes TE2 may include a plurality of third sensing patterns TP2 and a plurality of second bridge patterns BP2, which are arranged in the first direction DR1. At least one second bridge pattern BP2 may be connected between two adjacent third sensing patterns TP2. Each of the fourth sensing electrodes RE2 may include a plurality of fourth sensing patterns RP2 and a plurality of second extension patterns EP2, which are arranged in the second direction DR2. At least one second extension pattern EP2 may be connected between from two adjacent fourth sensing patterns RP2.

The first sensing electrodes TE1 and third sensing electrodes TE2 may have asymmetric shapes based on a boundary between the first and second sub-areas SSA1a and SSA2a. A length in the first direction DR1 of each of the first sensing electrodes TE1 may be different from that in the first direction DR1 of each of the third sensing electrodes TE2. Specifically, the first sensing electrode TE1 disposed at a last column (e.g., a seventh column) among the first sensing electrodes TE1 may have a length less than that of the third sensing electrode TE2 disposed at the last column among the third sensing electrodes TE2. That is, the first and third sensing electrodes TE1 and TE2 disposed at the same column may have different lengths from each other. A length difference between the first sensing electrode TE1 and the third sensing electrode TE2 may be set according to a line resistance difference between first transmission lines TL1a, TL2a, TL3a, TL4a, TL5a, TL6, and to TL7a and second transmission lines TL1b, TL2b, TL3b, TL4b, TL5b, TL6b, and TL7b.

The first sensing patterns (hereinafter, referred to as first boundary sensing patterns BTP1) disposed in the boundary between the first and second sub-areas SSA1a and SSA2a among the first sensing patterns TP1 may have an area that gradually decreases as a length of corresponding first transmission lines TL1a, TL2a, TL3a, TL4a, TL5a, TL6a, and TL7a increases. For example, the first boundary sensing pattern BTP1 disposed at the last column may have an area less than that of the first boundary sensing pattern BTP1 disposed at a first column. The area of the first boundary sensing pattern BTP1 may gradually decrease in a direction from the first column to the last column.

The second sensing patterns (hereinafter, referred to as second boundary sensing patterns BTP2) disposed in the boundary between the first and second sub-areas SSA1a and SSA2a among the second sensing patterns TP1 may have an area that gradually increases as a length of corresponding second transmission lines TL1b, TL2b, TL3b, TL4b, TL5b, TL6b, and TL7b increases. For example, the second boundary sensing pattern BTP2 disposed at the last column may have an area greater than that of the second boundary sensing pattern BTP2 disposed at the first column. The area of the second boundary sensing pattern BTP2 may gradually increase in a direction from the first column to the last column.

The destructive interference may not be exactly generated between the first and second transmission signals TS1 and TS2 when a line resistance difference between the first transmission lines TL1a, TL2a, TL3a, TL4a, TL5a, TL6a, and TL7a and the second transmission lines TL1b, TL2b, TL3b, TL4b, TL5b, TL6b, and TL7b is generated although the first transmission signal TS1 (refer to FIG. 5A) provided to the first sub-area SSA1a and the second transmission signal TS2 (refer to FIG. 5A) provided to the second sub-area SSA2a have inverted phases. In order to compensate the above-described line resistance difference, a length of each of the first sensing electrodes TE1 may be set to be equal to that of each of the third sensing electrodes TE2. In this case, the line resistance difference between the first transmission lines TL1a, TL2a, TL3a, TL4a, TL5a, TL6a, and TL7a and the second transmission lines TL1b, TL2b, TL3b, TL4b, TL5b, TL6b, and TL7b may be compensated by the length difference between the first sensing electrode TE1 and the third sensing electrode TE2. As a result, the destructive interference may be generated between the first and second transmission signals TS1 and TS2 although the line resistance difference exists, and thus the electro-magnetic interference (EMI) may be effectively improved.

The fifth sensing electrodes TE3 and the seventh sensing electrodes TE4 may have asymmetric shapes based on a boundary between the third and fourth sub-areas SSA3a and SSA4a. A length in the first direction DR1 of each of the fifth sensing electrodes TE3 may be different from that in the first direction DR1 of each of the seventh sensing electrodes TE4. Specifically, the fifth sensing electrode TE3 disposed at the first column among the fifth sensing electrodes TE3 may have a length less than that of the seventh sensing electrode TE4 disposed at the first column among the seventh sensing electrodes TE4. That is, the fifth and seventh sensing electrodes TE3 and TE4 disposed at the same column may have different lengths from each other. A length difference between the fifth sensing electrodes TE3 and the seventh sensing electrodes TE4 may be set according to a line resistance difference between third transmission lines TL1c, TL2c, TL3c, TL4c, TL5c, TL6c, and TL7c and fourth transmission lines TL1d, TL2d, TL3d, TL4d, TL5d, TL6d, and TL7d. Each of the fifth sensing electrodes TE3 may have a length that gradually increases in a direction from the first column to the last column. Each of the seventh sensing electrodes TE4 may have a length that gradually decreases in a direction from the first column to the last column.

The destructive interference may not be exactly generated between the third and fourth transmission signals TS3 and TS4 when a line resistance difference between the third transmission lines TL8a, TL9a, TL10a, TL11a, TL12a, TL13a, and TL14a and the fourth transmission lines TL8b, TL9b, TL10b, TL11b, TL12b, TL13b, and TL14b is generated although the third transmission signal TS3 (refer to FIG. 5A) provided to the third sub-area SSA3a and the fourth transmission signal TS4 (refer to FIG. 5A) provided to the fourth sub-area SSA4a have inverted phases. In order to compensate the above-described line resistance difference, a length of each of the fifth sensing electrodes TE3 may be set to be equal to that of each of the seventh sensing electrodes TE4. In this case, the line resistance difference between the third transmission lines TL8a, TL9a, TL10a, TL11a, TL12a, TL13a, and TL14a and the fourth transmission lines TL8b, TL9b, TL10b, TL11b, TL12b, TL13b, and TL14b may be compensated by the length difference between the fifth sensing electrode TE3 and the seventh sensing electrode TE4. As a result, the destructive interference may be generated between the third and fourth transmission signals TS3 and TS4 although the line resistance difference exists, and thus the electro-magnetic interference (EMI) may be effectively improved.

Figure 9:
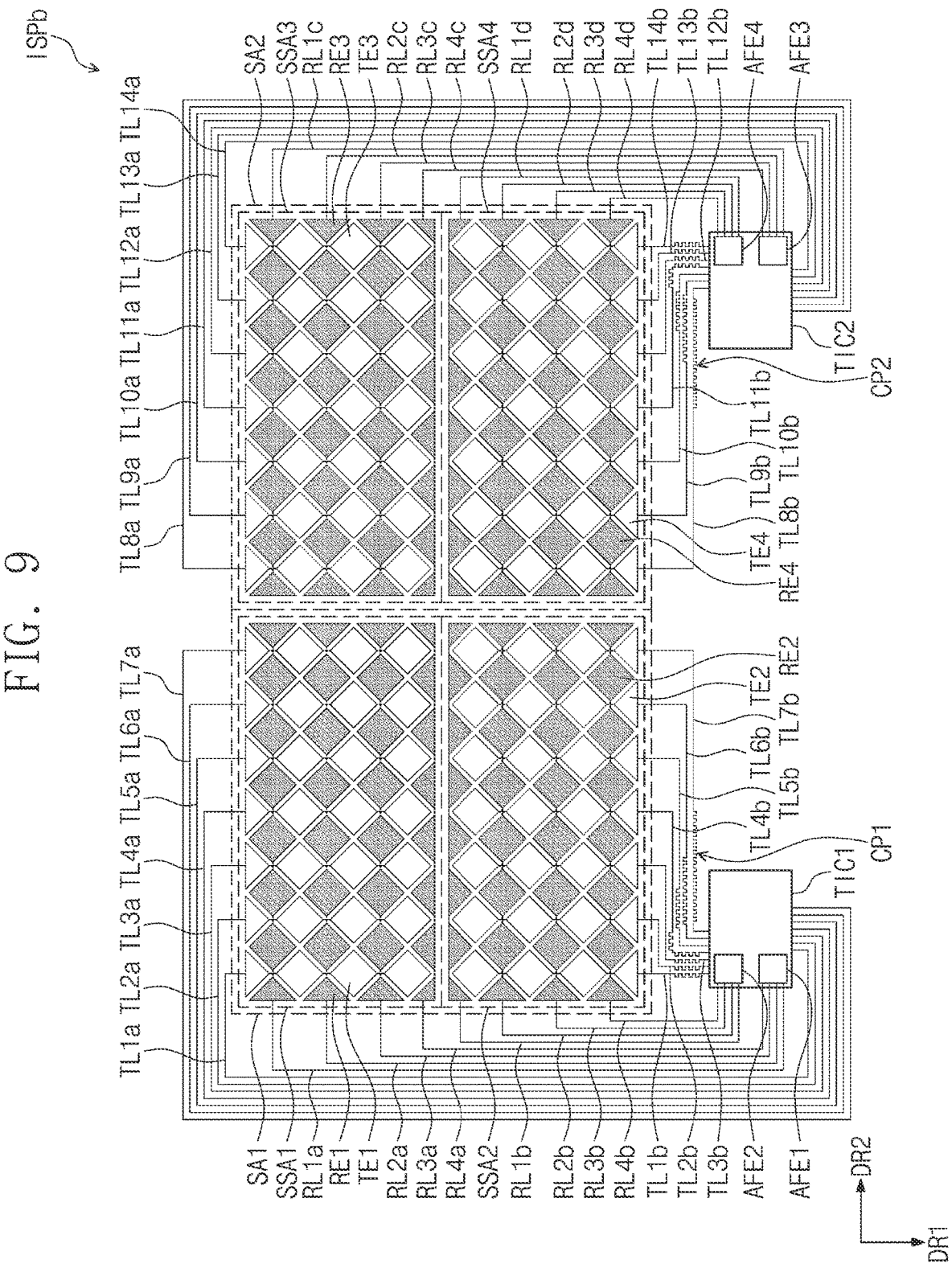
FIG. 9 is a plan view illustrating an input sensor according to an embodiment of the present disclosure.

FIG. 9 is a plan view illustrating an input sensor according to an embodiment of the present disclosure. In FIG. 9, the same components as those of FIG. 4 will be designated by the same reference numerals, and overlapped descriptions thereof will be omitted.

Referring to FIG. 9, an input sensor ISPb includes first transmission lines TL1a, TL2a, TL3a, TL4a, TL5a, TL6a, and TL7a, first reception lines RL1a, RL2a, RL3a, and RL4a, second transmission lines TL1b, TL2b, T13b, TL4b, TL5b, TL6b, and TL7b, and second reception lines RL1b, RL2b, RL3b, and RL4b. First resistance compensation patterns CP1 may be provided to the second transmission lines TL1b, TL2b, T13b, TL4b, TL5b, TL6b, and TL7b, respectively. The first resistance compensation patterns CP1 may compensate a line resistance difference between the first transmission lines TL1a, TL2a, TL3a, TL4a, TL5a, TL6a, and TL7a and the second transmission lines TL1b, TL2b, T13b, TL4b, TL5b, TL6b, and TL7b. Specifically, the first resistance compensation patterns CP1 may compensate a length difference between the first transmission lines TL1a, TL2a, TL3a, TL4a, TL5a, TL6a, and TL7a and the second transmission lines TL1b, TL2b, T13b, TL4b, TL5b, TL6b, and TL7b. An entire length of the second transmission lines TL1b, TL2b, T13b, TL4b, TL5b, TL6b, and TL7b may increase by the first resistance compensation patterns CP1. As a result, the line resistance difference caused by the length difference may be compensated to realize the equivalent resistance design. Thus, the destructive interference may be generated between the first and second transmission signals TS1 and TS2 (refer to FIG. 5A), and thus the electro-magnetic interference (EMI) may be effectively improved.

The input sensor ISPb further includes third transmission lines TL8a, TL9a, TL10a, TL11a, TL12a, TL13a, and TL14a, third reception lines RL1c, RL2c, RL3c, and RL4c, fourth transmission lines TL8b, TL9b, TL10b, TL11b, TL12b, TL13b, and TL14b, and fourth reception lines RL1d, RL2d, RL3d, and RL4d. Second resistance compensation patterns CP2 may be provided to the fourth transmission lines TL8b, TL9b, TL10b, TL11b, TL12b, TL13b, and TL14b, respectively. The second resistance compensation patterns CP2 may compensate a line resistance difference between the third transmission lines TL8a, TL9a, TL10a, TL11a, TL12a, TL13a, and TL14a and the fourth transmission lines TL8b, TL9b, TL10b, TL11b, TL12b, TL13b, and TL14b. Specifically, the second resistance compensation patterns CP2 may compensate a length difference between the third transmission lines TL8a, TL9a, TL10a, TL11a, TL12a, TL13a, and TL14a and the fourth transmission lines TL8b, TL9b, TL10b, TL11b, TL12b, TL13b, and TL14b. An entire length of the fourth transmission lines TL8b, TL9b, TL10b, TL11b, TL12b, TL13b, and TL14b may increase by the second resistance compensation patterns CP2. As a result, the line resistance difference caused by the length difference may be compensated to realize the equivalent resistance design. Thus, the destructive interference may be generated between the third and fourth transmission signals TS3 and TS4 (refer to FIG. 5A), and thus the electro-magnetic interference (EMI) may be effectively improved.

Figure 10A:
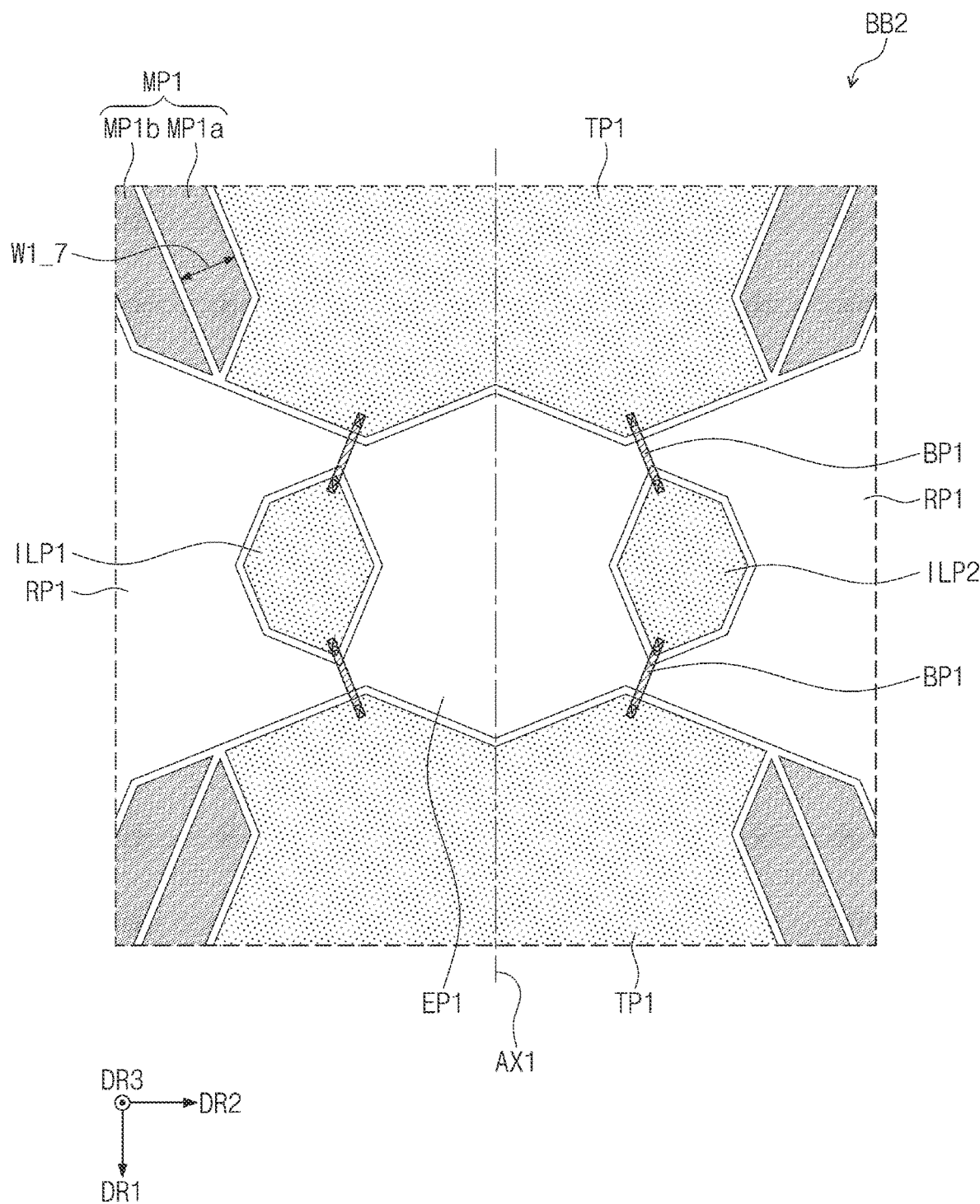
FIG. 10A is an enlarged plan view illustrating a second portion in FIG. 4.
Figure 10B:
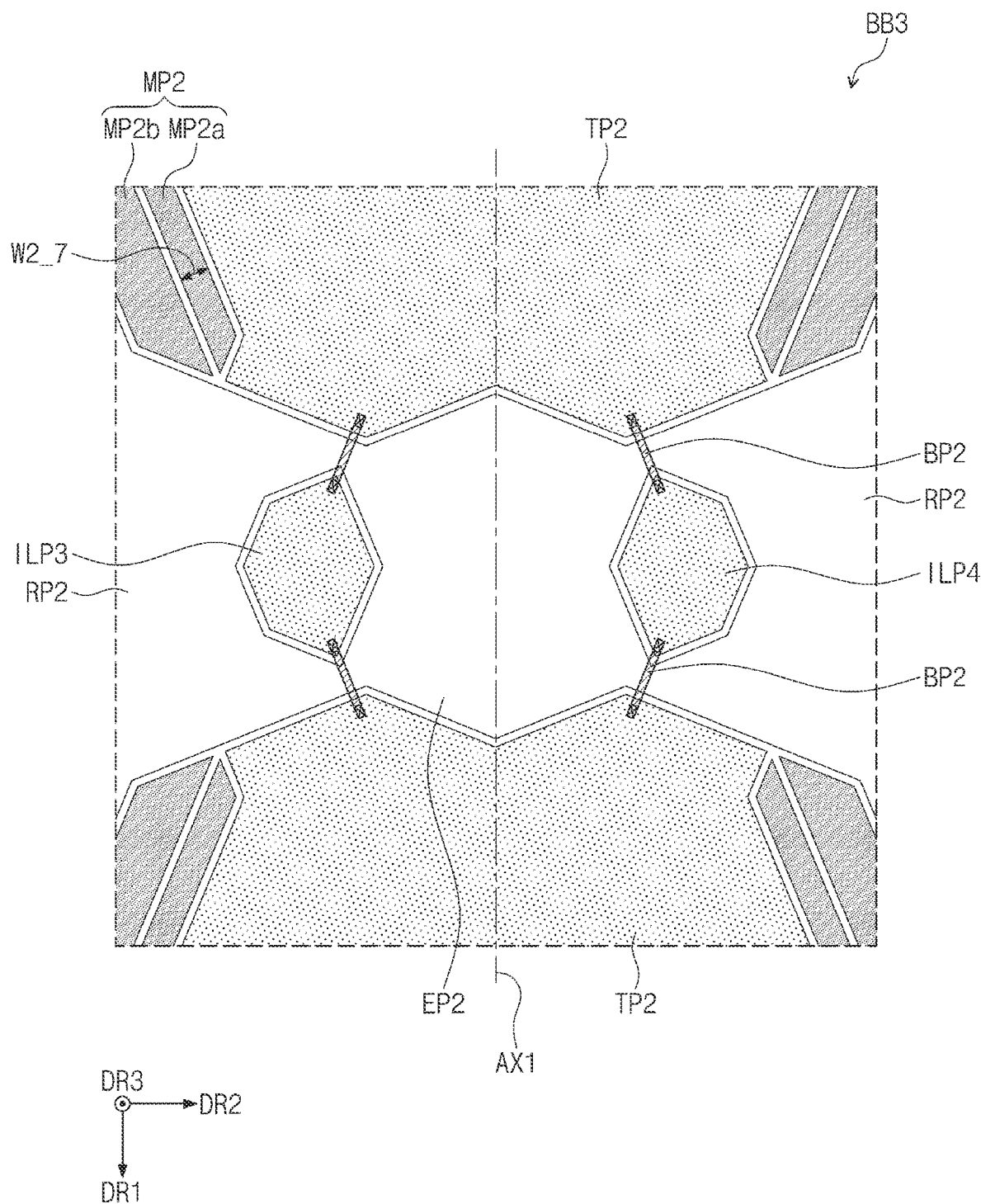
FIG. 10B is an enlarged plan view illustrating a third portion in FIG. 4.
Figure 10C:
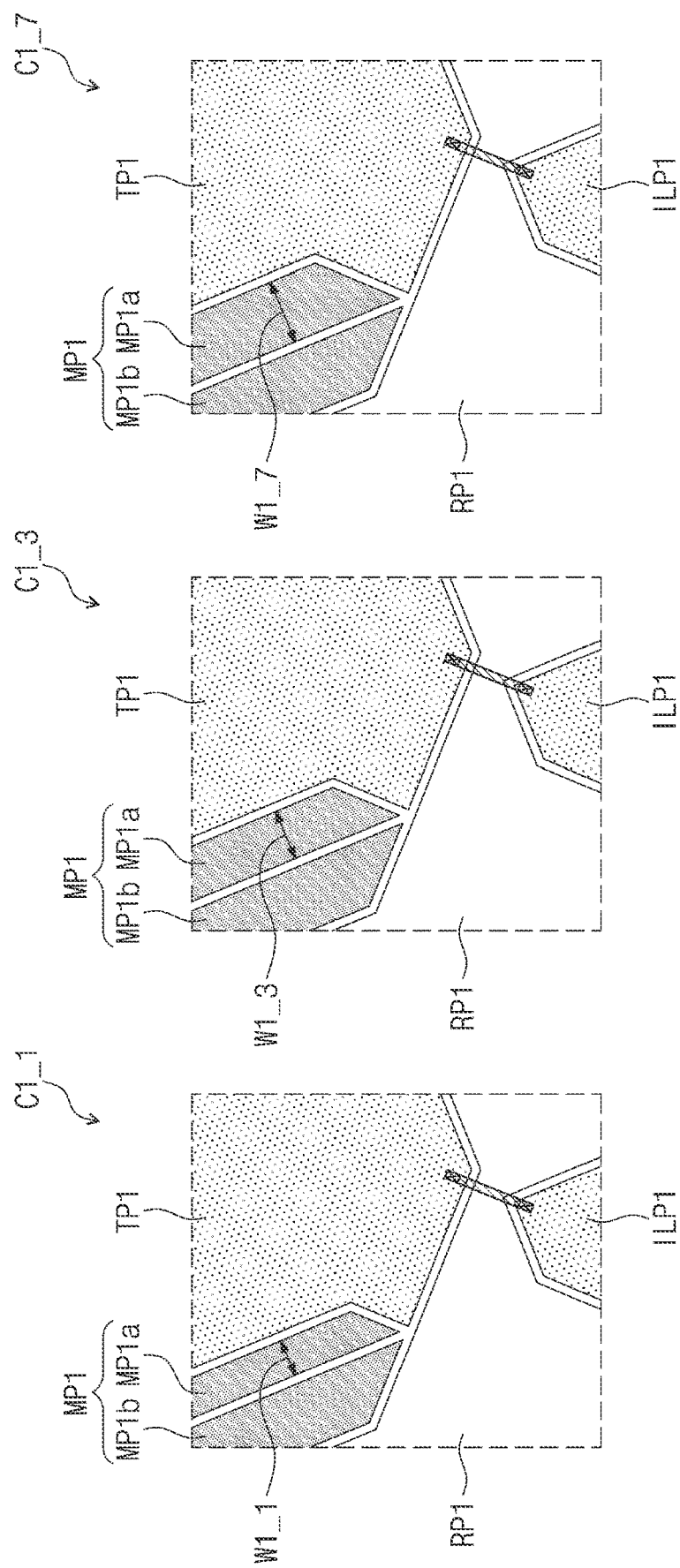
FIG. 10C is a view illustrating an area variation for each position of first sub-dummy patterns according to an embodiment of the present disclosure.
Figure 10D:
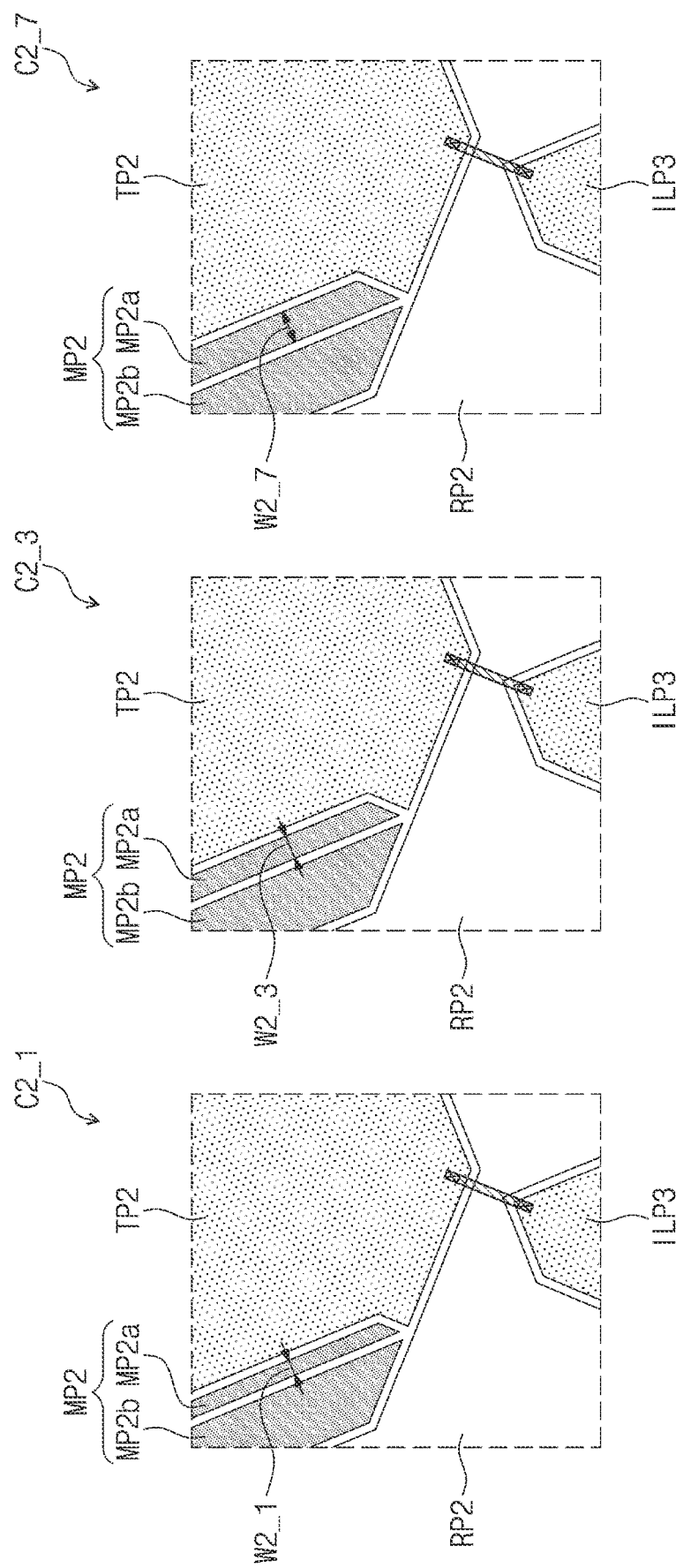
FIG. 10D is a view illustrating an area variation for each position of third sub-dummy patterns according to an embodiment of the present disclosure.

FIG. 10A is an enlarged plan view illustrating a second portion in FIG. 4, and FIG. 10B is an enlarged plan view illustrating a third portion in FIG. 4. FIG. 10C is a view illustrating an area variation for each position of first sub-dummy patterns according to an embodiment of the present disclosure. FIG. 10D is a view illustrating an area variation for each position of third sub-dummy patterns according to an embodiment of the inventive concept.

Referring to FIGS. 4, 10A, and 10B, the input sensor ISP may include the first sensing electrodes TE1, the second sensing electrodes RE1, the third sensing electrodes TE2, and the fourth sensing electrodes RE2.

Each of the first sensing electrodes TE1 may include the plurality of first sensing patterns TP1 and the plurality of first bridge patterns BP1, which are arranged in the first direction DR1. At least one first bridge pattern BP1 may be connected between two adjacent first sensing patterns TP1. Each of the second sensing electrodes RE1 may include the plurality of second sensing patterns RP1 and the plurality of first extension patterns EP1, which are arranged in the second direction DR2. At least one first extension pattern EP1 may be connected between two adjacent second sensing patterns RP1.

Each of the third sensing electrodes TE2 may include the plurality of third sensing patterns TP2 and the plurality of second bridge patterns BP2, which are arranged in the first direction DR1. At least one second bridge pattern BP2 may be connected between two adjacent third sensing patterns TP2. Each of the fourth sensing electrodes RE2 may include the fourth sensing patterns RP2 and the second extension patterns EP2, which are arranged in the second direction DR2. At least one second extension pattern EP2 may be connected between two adjacent fourth sensing patterns RP2.

As illustrated in FIG. 10A, the input sensor ISP may further include first and second island patterns ILP1 and ILP2. The first and second island patterns ILP1 and ILP2 may be electrically insulated from the second sensing patterns RP1 and the first extension patterns EP1 and electrically connected to the first sensing patterns TP1.

Each of the first and second island patterns ILP1 and ILP2 may have a hexagonal shape. However, this is merely illustrative. For example, the first island pattern ILP1 according to an embodiment of the present disclosure may have various shapes. The second island pattern ILP2 may have a shape symmetric to that of the first island pattern ILP1 based on a first axis AX1 extending in the first direction DR1. The second island pattern ILP2 may be spaced apart from the first island pattern ILP1 in the second direction DR2.

In an embodiment of the present disclosure, although four first bridge patterns BP1 are provided to connect two first sensing patterns TP1 as an example, the embodiment of the present disclosure is not limited to the number of the first bridge patterns BP1. Each of the first bridge patterns BP1 may be connected to one of the first sensing patterns TP1 and one of the first and second island patterns ILP1 and ILP2. The two first sensing patterns TP1, which are spaced apart from each other, may be electrically connected to each other through the first bridge patterns BP1 and the first and second island patterns ILP1 and ILP2.

The input sensor ISP may further include first dummy patterns MP1. The first dummy patterns MP1 may be provided through the same process as the first sensing patterns TP1 and the second sensing patterns RP1 and include the same material as the first sensing patterns TP1 and the second sensing patterns RP1. The first dummy patterns MP1, as floating electrodes, are not electrically connected to the first sensing patterns TP1 and the second sensing patterns RP1. The first dummy patterns MP1 may be disposed between the first sensing patterns TP1 and the second sensing patterns RP1. A limitation in which a boundary area between the first sensing patterns TP1 and the second sensing patterns RP1 is recognized may be reduced as the first dummy patterns MP1 are disposed therebetween. Each of the first dummy patterns MP1 may include a first sub-dummy pattern MP1$a$ and a second sub-dummy pattern MP1$b$.

The first sub-dummy patterns MP1$a$ may be disposed adjacent to the first sensing patterns TP1, respectively. The second sub-dummy patterns MP1$b$ may be disposed adjacent to the second sensing patterns RP1, respectively. The first sub-dummy patterns MP1$a$ and the second sub-dummy patterns MP1$b$ may be spaced apart from each other.

As illustrated in FIG. 10C, each of the first sub-dummy patterns MP1$a$ may have a width that gradually increases in a direction from a first column C1_1 to a last column C1_7. For example, each of the first sub-dummy patterns MP1$a$ may have a first width W1_1 at the first column C1_1, a second width W1_3 at a third column C1_3, and a third width W1_7 at the last column C1_7. The second width W1_3 may be greater than the first width W1_1, and the third width W1_7 may be greater than the second width W1_3.

As much as the width of each of the first sub-dummy patterns MP1$a$ increases, an area of the first sensing patterns TP1 may decrease. That is, the area of the first sensing patterns TP1 may gradually decrease in a direction from the first column C1_1 to the last column C1_7. An area difference between the first sensing patterns TP1 may be set according to a line resistance difference between the first transmission lines TL1$a$, TL2$a$, TL3$a$, TL4$a$, TL5$a$, TL6$a$, and TL7$a$ and the second transmission lines TL1$b$, TL2$b$, TL3$b$, TL4$b$, TL5$b$, TL6$b$, and TL7$b$.

Referring to FIG. 10B again, the input sensor ISP may further include third and fourth island patterns ILP3 and ILP4. The third and fourth island patterns ILP3 and ILP4 may be electrically insulated from the fourth sensing patterns RP2 and the second extension patterns EP2 and electrically connected to the third sensing patterns TP2.

In an embodiment of the present disclosure, although four second bridge patterns BP2 are provided to connect two third sensing patterns TP2 as an example, the embodiment of the present disclosure is not limited to the number of the second bridge patterns BP2. Each of the second bridge patterns BP2 may be connected to one of the third sensing patterns TP2 and one of the third and fourth island patterns ILP3 and ILP4. The two third sensing patterns TP2, which are spaced apart from each other, may be electrically connected to each other through the second bridge patterns BP2 and the third and fourth island patterns ILP3 and ILP4.

The input sensor ISP may further include second dummy patterns MP2. The second dummy patterns MP2 may be provided through the same process as the third sensing patterns TP2 and the fourth sensing patterns RP2 and include the same material as the third sensing patterns TP2 and the fourth sensing patterns RP2. The second dummy patterns MP2, as floating electrodes, are not electrically connected to the third sensing patterns TP2 and the fourth sensing patterns RP2. The second dummy patterns MP2 may be disposed between the third sensing patterns TP2 and the fourth sensing patterns RP2. A limitation in which a boundary area between the third sensing patterns TP2 and the fourth sensing patterns RP2 is recognized may be reduced as the second dummy patterns MP2 are disposed therebetween. Each of the second dummy patterns MP2 may include a third sub-dummy pattern MP2$a$ and a fourth sub-dummy pattern MP2$b$.

The third sub-dummy patterns MP2$a$ may be disposed adjacent to the third sensing patterns TP2, respectively. The fourth sub-dummy patterns MP2$b$ may be disposed adjacent to the fourth sensing patterns RP2, respectively. The third sub-dummy patterns MP2$a$ and the fourth sub-dummy patterns MP2$b$ may be spaced apart from each other.

As illustrated in FIG. 10D, each of the third sub-dummy patterns MP3$a$ may have a width that gradually increases in a direction from a first column C2_1 to a last column C2_7. For example, each of the third sub-dummy patterns MP2$a$ may have a first width W2_1 at the first column C2_1, a second width W2_3 at a third column C2_3, and a third width W2_7 at the last column C2_7. The second width W2_3 may be greater than the first width W2_1, and the third width W2_7 may be greater than the second width W2_3.

As much as the width of each of the third sub-dummy patterns MP2$a$ increases, an area of the third sensing patterns TP2 may decrease. That is, the area of the third sensing patterns TP2 may gradually decrease in a direction from the first column C2_1 to the last column C2_7. An area difference between the third sensing patterns TP2 may be set according to a line resistance difference between the first transmission lines TL1a, TL2a, TL3a, TL4a, TL5a, TL6a, and TL7a and the second transmission lines TL1b, TL2b, TL3b, TL4b, TL5b, TL6b, and TL7b.

Thus, the line resistance difference between the first transmission lines TL1a, TL2a, TL3a, TL4a, TL5a, TL6a, and TL7a and the second transmission lines TL1b, TL2b, TL3b, TL4b, TL5b, TL6b, and TL7b may be compensated to realize the equivalent resistance design. Thus, the destructive interference may be generated between the first and second transmission signals TS1 and TS2 (refer to FIG. 5A), and thus the electro-magnetic interference (EMI) may be effectively improved.

Figure 11:
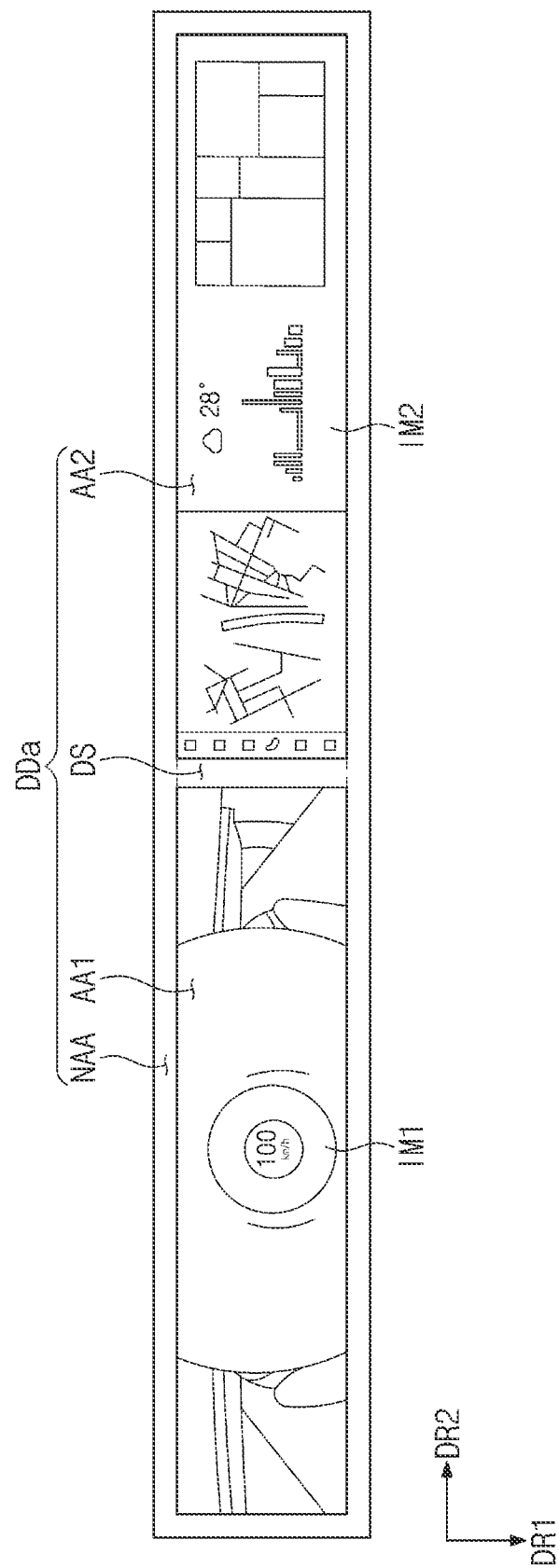
FIG. 11 is a plan view illustrating a display device according to an embodiment of the present disclosure.
Figure 12:
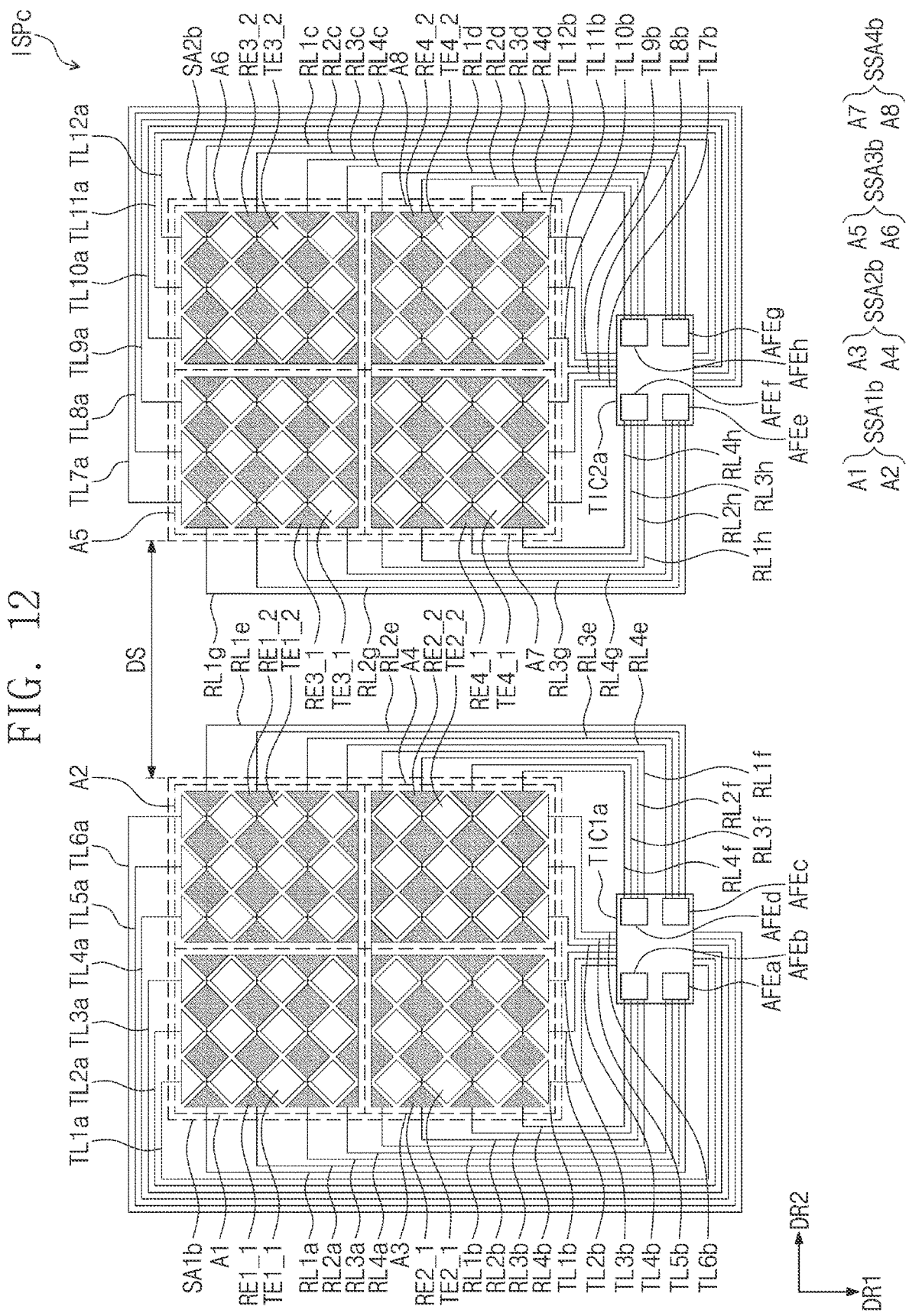
FIG. 12 is a plan view illustrating an input sensor according to an embodiment of the present disclosure.

FIG. 11 is a plan view illustrating a display device according to an embodiment of the present disclosure, and FIG. 12 is a plan view illustrating an input sensor according to an embodiment of the present disclosure. Among components illustrated in FIGS. 11 and 12, the same components as those illustrated in FIGS. 1B and 4 will be designated by the same reference numerals, and overlapped descriptions thereof will be omitted.

Referring to FIG. 11, a first active area AA1, a second active area AA2, a boundary area DS, and a peripheral area NAA may be defined on a display device DDa. Each of the first and second active areas AA1 and AA2 may be an area on which pixels are disposed to substantially display an image. In an embodiment of the present disclosure, an image displayed on the first active area AA1 is referred to as a first image IM1, and an image displayed on the second active area AA2 is referred to as a second image IM2. The first and second images IM1 and IM2 may be independent from each other. However, the embodiment of the present disclosure is not limited thereto. For example, the first and second images IM1 and IM2 may be dependent on each other.

Each of the boundary area DS and the peripheral area NAA may be an area on which the image IM is not displayed. The boundary area DS may be disposed between the first and second active areas AA1 and AA2, and the peripheral area NAA may surround the first and second active areas AA1 and AA2. However, the embodiment of the present disclosure is not limited thereto. For example, the peripheral area NAA may be disposed at only one side of one of the first and second active areas AA1 and AA2 or omitted.

Referring to FIG. 12, an input sensor ISPc includes a first sensing area SA1b and a second sensing area SA2b. The first sensing area SA1b and the second sensing area SA2b may be adjacent to each other in the second direction DR2.

The first sensing area SA1b includes a first sub-area SSA1b and a second sub-area SSA2b. The first and second sub-area SSA1b and SSA2b may be adjacent to each other in the first direction DR1. The second sensing area SA2b includes a third sub-area SSA3b and a fourth sub-area SSA4b. The third and fourth sub-area SSA3b and SSA4b may be adjacent to each other in the first direction DR1.

The first sub-area SSA1b includes a first area A1 and a second area A2. First sub-sensing electrodes TE1_1 and second sub-sensing electrodes RE1_1 are disposed in the first area A1, and third sub-sensing electrodes TE1_2 and fourth sub-sensing electrodes RE1_2 are disposed in the second area A2.

The second sub-area SSA2b includes a third area A3 and a fourth area A4. Fifth sub-sensing electrodes TE2_1 and sixth sub-sensing electrodes RE2_1 are disposed in the third area A3, and seventh sub-sensing electrodes TE2_2 and eighth sub-sensing electrodes RE2_2 are disposed in the fourth area A4.

The first sub-sensing electrodes TE1_1 and the third sub-sensing electrodes TE1_2 receive the first transmission signal TS1 (refer to FIG. 5A) from the first sensor controller TIC1. The fifth sub-sensing electrodes TE2_1 and the seventh sub-sensing electrodes TE2_2 receive the second transmission signal TS2 (refer to FIG. 5A) from the first sensor controller TIC1. The second transmission signal TS2 may have a phase inverted from that of the first transmission signal TS1. Alternatively, the first sub-sensing electrodes TE1_1 and the third sub-sensing electrodes TE1_2 may respectively receive first and second sub-transmission signals having inverted phases from the first sensor controller TIC1. Also, the fifth sub-sensing electrodes TE2_1 and the seventh sub-sensing electrodes TE2_2 may respectively receive third and fourth sub-transmission signals having inverted phases from the first sensor controller TIC1.

The first sub-sensing electrodes TE1_1 and the third sub-sensing electrodes TE1_2 may be spaced apart from each other at a boundary between the first and third areas A1 and A3. The first sub-sensing electrodes TE1_1 and the third sub-sensing electrodes TE1_2 may be electrically insulated from each other. The fifth sub-sensing electrodes TE2_1 and the seventh sub-sensing electrodes TE2_2 may be spaced apart from each other at a boundary between the second and fourth areas A2 and A4. The fifth sub-sensing electrodes TE2_1 and the seventh sub-sensing electrodes TE2_2 may be electrically insulated from each other.

The second sub-sensing electrodes RE1_1 and the fourth sub-sensing electrodes RE1_2 may be spaced apart from each other at a boundary between the first and second areas A1 and A2. The second sub-sensing electrodes RE1_1 and the fourth sub-sensing electrodes RE1_2 may be electrically insulated from each other. The sixth sub-sensing electrodes RE2_1 and the eighth sub-sensing electrodes RE2_2 may be spaced apart from each other at a boundary between the third and fourth areas A3 and A4. The sixth sub-sensing electrodes RE2_1 may be electrically insulated from the eighth sub-sensing electrodes RE2_2.

The input sensor ISPc includes first transmission lines TL1a, TL2a, TL3a, TL4a, TL5a, and TL6a, first sub-reception lines RL1a, RL2a, RL3a, and RL4a, second sub-reception lines RL1e, RL2e, RL3e, and RL4e, second transmission lines TL1b, TL2b, TL3b, TL4b, TL5b, and TL6b, third sub-reception lines RL1b, RL2b, RL3b, and RL4b, and fourth sub-reception lines RL1f, RL2f, RL3f, and RL4f.

The first transmission lines TL1a, TL2a, TL3a, TL4a, TL5a, and TL6a are connected to the first and third sub-sensing electrodes TE1_1 and TE1_2, and the second transmission lines TL1b, TL2b, TL3b, TL4b, TL5b, and TL6b are connected to the fifth and seventh sub-sensing electrodes TE2_1 and TE2_2. The first sub-reception lines RL1a, RL2a, RL3a, and RL4a are connected to the second sub-sensing electrodes RE1_1, and the second sub-reception lines RL1e, RL2e, RL3e, and RL4e are connected to the fourth sub-sensing electrodes RE1_2. The third sub-reception lines RL1b, RL2b, RL3b, and RL4b are connected to the sixth sub-sensing electrodes RE2_1, and the fourth sub-reception lines RL1f, RL2f, RL3f, and RL4f are connected to the eighth sub-sensing electrodes RE2_2.

The first sensor controller TIC1 include a first data acquisition part AFEa, a second data acquisition part AFEb, a third data acquisition part AFEc, and a fourth data acquisition part AFEd. The first data acquisition part AFEa receives a first sub-reception signal through the first sub-reception lines RL1a, RL2a, RL3a, and RL4a, and the second data acquisition part AFEb receives a second sub-reception signal through the second sub-reception lines RL1e, RL2e, RL3e, and RL4e. The third data acquisition part AFEc receives a third sub-reception signal through the third sub-reception lines RL1b, RL2b, RL3b, and RL4b, and the fourth data acquisition part AFEd receives a fourth sub-reception signal through the fourth sub-reception lines RL1f, RL2f, RL3f, and RL4f.

The first sensor controller TIC1 may sense a variation of capacitance (hereinafter, referred to as mutual capacitance) between the first and second sub-sensing electrodes TE1_1 and RE1_1 in the first area A1 based on the first sub-reception signal and generate coordinate information of a position at which the variation is sensed. The first sensor controller TIC1 may sense a variation of mutual capacitance between the third and fourth sub-sensing electrodes TE1_2 and RE1_2 in the second area A2 based on the second sub-reception signal and generate coordinate information of a position at which the variation is sensed. The first sensor controller TIC1 may sense a variation of capacitance (hereinafter, referred to as mutual capacitance) between the fifth and sixth sub-sensing electrodes TE2_1 and RE2_1 in the third area A3 based on the third sub-reception signal and generate coordinate information of a position at which the variation is sensed. The first sensor controller TIC1 may sense a variation of mutual capacitance between the seventh and eighth sub-sensing electrodes TE2_2 and RE2_2 in the fourth area A4 based on the fourth sub-reception signal and generate coordinate information of a position at which the variation is sensed.

In an embodiment of the present disclosure, a mode of sensing a variation of mutual capacitance and sensing an input is referred to as a first sensing mode, and a mode of sensing an input in a self-cap method is referred to as a second sensing mode.

In the first sensing mode, a bias voltage may be applied to the first sub-reception lines RL1a, RL2a, RL3a, and RL4a, the second sub-reception lines RL1e, RL2e, RL3e, and RL4e, the third sub-reception lines RL1b, RL2b, RL3b, and RL4b, and the fourth sub-reception lines RL1f, RL2f, RL3f, and RL4f.

Also, in the second sensing mode, the first sensor controller TIC1 may apply the first sub-transmission signal to the first sub-reception lines RL1a, RL2a, RL3a, and RL4a and the second sub-transmission signal having a phase inverted from that of the first sub-transmission signal to the second sub-reception lines RL1e, RL2e, RL3e, and RL4e. In the second sensing mode, the first sensor controller TIC1 may apply the third sub-transmission signal to the third sub-reception lines RL1b, RL2b, RL3b, and RL4b and the fourth sub-transmission signal having a phase inverted from that of the third sub-transmission signal to the fourth sub-reception lines RL1f, RL2f, RL3f, and RL4f. In an embodiment of the present disclosure, the first sub-transmission signal may have a phase inverted from that of the third sub-transmission signal, and the second sub-transmission signal may have a phase inverted from that of the fourth sub-transmission signal.

Thus, the destructive interference may be generated between the first to fourth sub-transmission signals although the second and fourth sub-sensing electrodes RE1_1 and RE1_2 and the sixth and eighth sub-sensing electrodes RE2_1 and RE2_2 receive the first to fourth sub-transmission signals in the second sensing mode. Thus, the electromagnetic interference (EMI) may be effectively improved even in the second sensing mode.

The third sub-area SSA3b includes a fifth area A5 and a sixth area A6. Ninth sub-sensing electrodes TE3_1 and tenth sub-sensing electrodes RE3_1 are disposed in the fifth area A5, and eleventh sub-sensing electrodes TE3_2 and twelfth sub-sensing electrodes RE3_2 are disposed in the sixth area A6.

The fourth sub-area SSA4b includes a seventh area A7 and an eighth area A8. Thirteenth sub-sensing electrodes TE4_1 and fourteenth sub-sensing electrodes RE4_1 are disposed in the seventh area A7, and fifteenth sub-sensing electrodes TE4_2 and sixteenth sub-sensing electrodes RE4_2 are disposed in the eighth area A8.

The ninth sub-sensing electrodes TE3_1 and the eleventh sub-sensing electrodes TE3_2 receive the third transmission signal TS3 (refer to FIG. 5A) from the second sensor controller TIC2. The thirteenth sub-sensing electrodes TE4_1 and the fifteenth sub-sensing electrodes TE4_2 receive the fourth transmission signal TS4 (refer to FIG. 5A) from the second sensor controller TIC2. The fourth transmission signal TS4 may have a phase inverted from that of the third transmission signal TS3. Alternatively, the ninth sub-sensing electrodes TE3_1 and the eleventh sub-sensing electrodes TE3_2 may respectively receive fifth and sixth sub-transmission signals having inverted phases from the second sensor controller TIC2. Also, the thirteenth sub-sensing electrodes TE4_1 and the fifteenth sub-sensing electrodes TE4_2 may respectively receive seventh and eighth sub-transmission signals having inverted phases from the second sensor controller TIC2.

The ninth sub-sensing electrodes TE3_1 and the eleventh sub-sensing electrodes TE3_2 may be spaced apart from each other at a boundary between the fifth and sixth areas A5 and A6. The ninth sub-sensing electrodes TE3_1 and the eleventh sub-sensing electrodes TE3_2 may be electrically insulated from each other. The thirteenth sub-sensing electrodes TE4_1 and the fifteenth sub-sensing electrodes TE4_2 may be spaced apart from each other at a boundary between the seventh and eighth areas A7 and A8. The thirteenth sub-sensing electrodes TE4_1 and the fifteenth sub-sensing electrodes TE4_2 may be electrically insulated from each other.

The tenth sub-sensing electrodes RE3_1 and the twelfth sub-sensing electrodes RE3_2 may be spaced apart from each other at a boundary between the fifth and sixth areas A5 and A6. The tenth sub-sensing electrodes RE3_1 and the twelfth sub-sensing electrodes RE3_2 may be electrically insulated from each other. The fourteenth sub-sensing electrodes RE4_1 and the sixteenth sub-sensing electrodes RE4_2 may be spaced apart from each other at a boundary between the seventh and eighth areas A7 and A8. The fourteenth sub-sensing electrodes RE4_1 and the sixteenth sub-sensing electrodes RE4_2 may be electrically insulated from each other.

The input sensor ISPc includes third transmission lines TL7a, TL8a, TL9a, TL10a, TL11a, and TL12a, fifth sub-reception lines RL1c, RL2c, RL3c, and RL4c, sixth sub-reception lines RL1g, RL2g, RL3g, and RL4g, fourth transmission lines TL7b, TL8b, TL9b, TL10b, TL11b, and TL12b, seventh sub-reception lines RL1d, RL2d, RL3d, and RL4d, and eighth sub-reception lines RL1h, RL2h, RL3h, and RL4h.

The third transmission lines TL7a, TL8a, TL9a, TL10a, TL11a, and TL12a are connected to the ninth and eleventh sub-sensing electrodes TE3_1 and TE3_2, and the fourth transmission lines TL7b, TL8b, TL9b, TL10b, TL11b, and TL12b are connected to the thirteenth and fifteenth sub-sensing electrodes TE4_1 and TE4_2. The fifth sub-reception lines RL1c, RL2c, RL3c, and RL4c are connected to the tenth sub-sensing electrodes RE3_1, and the sixth sub-reception lines RL1g, RL2g, RL3g, and RL4g are connected to the twelfth sub-sensing electrodes RE3_2. The seventh sub-reception lines RL1d, RL2d, RL3d, and RL4d are connected to the fourteenth sub-sensing electrodes RE4_1, and the eighth sub-reception lines RL1h, RL2h, RL3h, and RL4h are connected to the sixteenth sub-sensing electrodes RE4_2.

The second sensor controller TIC2 include a fifth data acquisition part AFEe, a sixth data acquisition part AFEf, a seventh data acquisition part AFEg, and an eighth data acquisition part AFEh. The fifth data acquisition part AFEe receives a fifth sub-reception signal through the fifth sub-reception lines RL1c, RL2c, RL3c, and RL4c, and the sixth data acquisition part AFEf receives a sixth sub-reception signal through the sixth sub-reception lines RL1g, RL2g, RL3g, and RL4g. The seventh data acquisition part AFEg receives a seventh sub-reception signal through the seventh sub-reception lines RL1d, RL2d, RL3d, and RL4d, and the eighth data acquisition part AFEh receives an eighth sub-reception signal through the eighth sub-reception lines RL1h, RL2h, RL3h, and RL4h.

The second sensor controller TIC2 may sense a variation of capacitance (hereinafter, referred to as mutual capacitance) between the ninth and tenth sub-sensing electrodes TE3_1 and RE3_1 in the fifth area A5 based on the fifth sub-reception signal and generate coordinate information of a position at which the variation is sensed. The second sensor controller TIC2 may sense a variation of mutual capacitance between the eleventh and twelfth sub-sensing electrodes TE3_2 and RE3_2 in the sixth area A6 based on the sixth sub-reception signal and generate coordinate information of a position at which the variation is sensed. The second sensor controller TIC2 may sense a variation of capacitance (hereinafter, referred to as mutual capacitance) between the thirteenth and fourteenth sub-sensing electrodes TE4_1 and RE4_1 in the seventh area A7 based on the seventh sub-reception signal and generate coordinate information of a position at which the variation is sensed. The second sensor controller TIC2 may sense a variation of mutual capacitance between the fifteenth and sixteenth sub-sensing electrodes TE4_2 and RE4_2 in the eighth area A8 based on the eighth sub-reception signal and generate coordinate information of a position at which the variation is sensed.

In the first sensing mode, a bias voltage may be applied to the fifth sub-reception lines RL1c, RL2c, RL3c, and RL4c, the sixth sub-reception lines RL1g, RL2g, RL3g, and RL4g, the seventh sub-reception lines RL1d, RL2d, RL3d, and RL4d, and the eighth sub-reception lines RL1h, RL2h, RL3h, and RL4h.

Also, in the second sensing mode, the second sensor controller TIC2 may apply the fifth sub-transmission signal to the fifth sub-reception lines RL1c, RL2c, RL3c, and RL4c and the sixth sub-transmission signal having a phase inverted from that of the fifth sub-transmission signal to the sixth sub-reception lines RL1g, RL2g, RL3g, and RL4g. In the second sensing mode, the second sensor controller TIC2 may apply the seventh sub-transmission signal to the seventh sub-reception lines RL1d, RL2d, RL3d, and RL4d and the eighth sub-transmission signal having a phase inverted from that of the seventh sub-transmission signal to the eighth sub-reception lines RL1h, RL2h, RL3h, and RL4h. In an embodiment of the present disclosure, the fifth sub-transmission signal may have a phase inverted from that of the seventh sub-transmission signal, and the sixth sub-transmission signal may have a phase inverted from that of the eighth sub-transmission signal.

Thus, the destructive interference may be generated between the fifth to sixth sub-transmission signals although the tenth and twelfth sub-sensing electrodes RE3_1 and RE3_2 and the fourteenth and sixteenth sub-sensing electrodes RE4_1 and RE4_2 receive the fifth to eighth sub-transmission signals in the second sensing mode. Thus, the electro-magnetic interference (EMI) may be effectively improved even in the second sensing mode.

According to an embodiment of the present disclosure, the destructive interference may be generated between the first and second transmission signals by providing the first transmission signal to the first sub-area and the second transmission signal having the phase inverted from that of the first transmission signal to the second sub-area. Thus, the electro-magnetic interference (EMI) may be improved by the destructive interference between the first and second transmission signals.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Hence, the real protective scope of the present disclosure shall be determined by the technical scope of the accompanying claims.

What is claimed is:
1. A display device comprising:
a display panel configured to display an image;
an input sensor disposed on the display panel and including a first sensing area configured to sense an input, wherein the first sensing area has a first sub-area and a second sub-area; and
a first sensor controller configured to drive the first sensing area,
wherein the input sensor includes:
first sensing electrodes disposed in the first sub-area to receive a first transmission signal from the first sensor controller;
second sensing electrodes disposed in the first sub-area and intersected with the first sensing electrodes;
third sensing electrodes disposed in the second sub-area to receive a second transmission signal having a phase inverted from a phase of the first transmission signal from the first sensor controller;
fourth sensing electrodes disposed in the second sub-area and intersected with the third sensing electrodes;
first transmission lines connected to the first sensing electrodes; and
second transmission lines connected to the third sensing electrodes,
wherein at least one of an amplitude difference between the first transmission signal and the second transmission signal, area differences between the first sensing electrodes and the third sensing electrodes, or length differences between the first sensing electrodes and the third sensing electrodes is set according to a line resistance difference between the first transmission lines and the second transmission lines.
2. The display device of claim 1, wherein the first sensor controller includes:
a first data acquisition part connected to the second sensing electrodes; and a second data acquisition part connected to the fourth sensing electrodes, wherein a first reception signal is transmitted from the second sensing electrodes to the first data acquisition part, and a second reception signal is transmitted from the fourth sensing electrodes to the second data acquisition part.

3. The display device of claim 1, wherein the first sub-area is disposed adjacent to the second sub-area in a first direction, and the first sensing electrodes are spaced apart from the third sensing electrodes at a boundary between the first sub-area and the second sub-area.

4. The display device of claim 3, wherein each of the first sensing electrodes and the third sensing electrodes extends in the first direction, and each of the second sensing electrodes and the fourth sensing electrodes extends in a second direction crossing the first direction.

5. The display device of claim 4, wherein the input sensor further includes:

first reception lines connected to the second sensing electrodes; and second reception lines connected to the fourth sensing electrodes.

6. The display device of claim 5, wherein the first sensing electrodes and the third sensing electrodes have symmetric shapes based on the boundary when viewed on a plane.

7. The display device of claim 6, wherein the first transmission signal and the second transmission signal have different amplitudes.

8. The display device of claim 5, wherein the first sensing electrodes and the third sensing electrodes have the same length in the first direction, and the first sensing electrodes and the third sensing electrodes have different areas, when viewed on a plane.

9. The display device of claim 8, wherein the input sensor includes:

first dummy patterns disposed around the first sensing electrodes; and second dummy patterns disposed around the third sensing electrodes, and the first dummy patterns and the second dummy patterns have different areas due to area differences between the first sensing electrodes and the third sensing electrodes.

10. The display device of claim 8, wherein the first transmission signal and the second transmission signal have a same amplitude as each other.

11. The display device of claim 5, wherein the first sensing electrodes and the third sensing electrodes have asymmetric shapes based on the boundary, when viewed on a plane.

12. The display device of claim 11, wherein the first sensing electrodes and the third sensing electrodes have different lengths in the first direction.

13. The display device of claim 1, wherein the input sensor further includes a second sensing area disposed adjacent to the first sensing area in a second direction, and the second sensing area includes a third sub-area and a fourth sub-area, which are disposed adjacent to each other in a first direction crossing the second direction.

14. The display device of claim 13, further comprising a second sensor controller connected to the second sensing area.

15. The display device of claim 14, wherein the input sensor includes:

fifth sensing electrodes disposed in the third sub-area to receive a third transmission signal from the second sensor controller;

sixth sensing electrodes disposed in the third sub-area and intersected with the fifth sensing electrodes;

seventh sensing electrodes disposed in the fourth sub-area to receive a fourth transmission signal having a phase inverted from that of the third transmission signal from the second sensor controller; and eighth sensing electrodes disposed in the fourth sub-area and intersected with the seventh sensing electrodes.

16. The display device of claim 15, wherein the second sensor controller includes:

a third data acquisition part connected to the sixth sensing electrodes; and a fourth data acquisition part connected to the eighth sensing electrodes, wherein a third reception signal is transmitted from the sixth sensing electrodes to the third data acquisition part, and a fourth reception signal is transmitted from the eighth sensing electrodes to the fourth data acquisition part.

17. An electronic display device comprising;

a display panel configured to display an image;

an input sensor disposed on the display panel and including a first sensing area configured to sense an input, wherein the first sensing area has a first sub-area and a second sub-area; and a first sensor controller configured to drive the first sensing area, wherein the input sensor includes:

first sensing electrodes disposed in the first sub-area to receive a first transmission signal from the first sensor controller;

second sensing electrodes disposed in the first sub-area and intersected with the first sensing electrodes;

third sensing electrodes disposed in the second sub-area to receive a second transmission signal having a phase inverted from a phase of the first transmission signal from the first sensor controller; and fourth sensing electrodes disposed in the second sub-area and intersected with the third sensing electrodes, wherein a second boundary sensing electrode is disposed adjacent to a boundary among the second sensing electrodes and has a size different from a size of each of the rest second sensing electrodes, and a fourth boundary sensing electrode is disposed adjacent to a boundary among the fourth sensing electrodes and has a size different a size from of each of the rest fourth sensing electrodes.

18. A display device comprising:

a display panel configured to display an image;

an input sensor disposed on the display panel and including a first sensing area configured to sense an input, wherein the first sensing area has a first sub-area and a second sub-area; and a first sensor controller configured to drive the first sensing area, wherein the input sensor includes:

first sensing electrodes disposed in the first sub-area to receive a first transmission signal from the first sensor controller;

second sensing electrodes disposed in the first sub-area and intersected with the first sensing electrodes;

third sensing electrodes disposed in the second sub-area to receive a second transmission signal having a phase inverted from a phase of the first transmission signal from the first sensor controller; and fourth sensing electrodes disposed in the second sub-area and intersected with the third sensing electrodes, wherein the first sub-area includes first and second areas, when viewed on a plane, the second sensing electrodes include first sub-sensing electrodes disposed in the first area and second sub-sensing electrodes disposed in the second area, the second sub-area includes third and fourth areas, and the fourth sensing electrodes include third sub-sensing electrodes disposed in the third area and fourth sub-sensing electrodes disposed in the fourth area.

19. The display device of claim 18, wherein the input sensor includes:

first transmission lines connected to the first sensing electrodes;

first sub-reception lines connected to the first sub-sensing electrodes;

second sub-reception lines connected to the second sub-sensing electrodes;

second transmission lines connected to the third sensing electrodes;

third sub-reception lines connected to the third sub-sensing electrodes; and fourth sub-reception lines connected to the fourth sub-sensing electrodes.

20. The display device of claim 19, wherein in a first sensing mode, a bias voltage is applied to the first, second, third, and fourth sub-reception lines, and in a second sensing mode, a first sub-transmission signal is applied to each of the first and third sub-reception lines, and a second sub-transmission signal having a phase inverted from a phase of the first sub-transmission signal is applied to each of the second and fourth sub-reception lines.

* * * * *